US008530286B2

(12) United States Patent
Shifren et al.

(10) Patent No.: US 8,530,286 B2
(45) Date of Patent: Sep. 10, 2013

(54) LOW POWER SEMICONDUCTOR TRANSISTOR STRUCTURE AND METHOD OF FABRICATION THEREOF

(75) Inventors: Lucian Shifren, San Jose, CA (US);
Pushkar Ranade, Los Gatos, CA (US);
Scott E. Thompson, Gainesville, FL (US); Sachin R. Sonkusale, Los Gatos, CA (US); Weimin Zhang, Campbell, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 12/971,884

(22) Filed: Dec. 17, 2010

(65) Prior Publication Data
US 2011/0248352 A1    Oct. 13, 2011

Related U.S. Application Data

(60) Provisional application No. 61/323,255, filed on Apr. 12, 2010.

(51) Int. Cl.
*H01L 21/00* (2006.01)
*H01L 21/84* (2006.01)

(52) U.S. Cl.
USPC ........... 438/151; 438/154; 438/166; 438/174; 438/194; 438/196; 438/199; 438/207; 438/217; 438/221; 438/275; 438/289; 438/294; 438/424; 438/514; 438/530; 257/204; 257/337; 257/351; 257/366; 257/374; 257/402; 257/406; 257/499; 257/506; 257/510; 257/E27.067; 257/E21.611; 257/E21.618; 257/E21.632; 257/E21.639

(58) Field of Classification Search
USPC ................. 257/204, 337, 338, 351, 368, 374, 257/402, 406, 499–501, 506, 510, E27.046, 257/E27.059, E27.06, E27.062, E27.064, 257/E27.067, E21.002, E21.532, E21.536, 257/E21.54, E21.546, E21.598, E21.602, 257/E21.611, E21.618, E21.625, E21.632, 257/E21.633, E21.639; 438/151, 154, 438/438/166, 174, 194, 196, 199, 207, 217, 438/218, 221, 275, 289, 294, 424, 514, 522, 438/530, FOR. 187, FOR. 216, FOR. 227
See application file for complete search history.

(56) References Cited

U.S. PATENT DOCUMENTS 3,958,266 A    5/1976 Athanas
4,000,504 A    12/1976 Berger
(Continued)

FOREIGN PATENT DOCUMENTS

EP    0274278    7/1988
EP    0312237    4/1989
(Continued)

OTHER PUBLICATIONS

PCT Notice of Transmittal of the International Search Report and the Written Opinion of the International Search Authority, or the Declaration, PCT/US 11/31531; 8 pp. dated Jun. 29, 2011.
(Continued)

*Primary Examiner* — Meiya Li
(74) *Attorney, Agent, or Firm* — Baker Botts L.L.P.

(57) ABSTRACT

A structure and method of fabrication thereof relate to a Deeply Depleted Channel (DDC) design, allowing CMOS based devices to have a reduced $\sigma V_T$ compared to conventional bulk CMOS and can allow the threshold voltage $V_T$ of FETs having dopants in the channel region to be set much more precisely. The DDC design also can have a strong body effect compared to conventional bulk CMOS transistors, which can allow for significant dynamic control of power consumption in DDC transistors. The semiconductor structure includes an analog device and a digital device each having an epitaxial channel layer where a single gate oxidation layer is on the epitaxial channel layer of NMOS and PMOS transistor elements of the digital device and one of a double and triple gate oxidation layer is on the epitaxial channel layer of NMOS and PMOS transistor elements of the analog device.

19 Claims, 15 Drawing Sheets

(56) References Cited

U.S. PATENT DOCUMENTS

| | | |
|---|---|---|
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A * | 5/1999 | Farrenkopf et al. ............ 438/202 |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |

| | | |
|---|---|---|
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perug et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,442,971 B2 | 10/2008 | Wirbeleit et al. |
| 7,449,733 B2 | 11/2008 | Inaba et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,761,820 B2 | 7/2010 | Berger et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |

| | | |
|---|---|---|
| 7,906,413 B2 | 3/2011 | Cardone et al. |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara |
| 2003/0173626 A1 | 9/2003 | Burr |
| 2003/0215991 A1 | 11/2003 | Sohn et al. |
| 2003/0215992 A1 | 11/2003 | Sohn et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0056877 A1 | 3/2005 | Rueckes et al. |
| 2005/0093021 A1 | 5/2005 | Ouyang et al. |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0276094 A1 | 12/2005 | Yamaoka et al. |
| 2005/0280075 A1 | 12/2005 | Ema et al. |
| 2006/0017100 A1 | 1/2006 | Bol et al. |
| 2006/0049464 A1 | 3/2006 | Rao |
| 2006/0068586 A1 | 3/2006 | Pain |
| 2006/0071278 A1 | 4/2006 | Takao |
| 2006/0091481 A1 | 5/2006 | Li et al. |
| 2006/0154428 A1 | 7/2006 | Dokumaci |
| 2006/0157794 A1 | 7/2006 | Doyle et al. |
| 2006/0163674 A1 | 7/2006 | Cho |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1* | 10/2006 | Venugopal et al. ........... 438/197 |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0194383 A1 | 8/2007 | Kato |
| 2007/0212861 A1 | 9/2007 | Chidambarrao et al. |
| 2007/0238253 A1 | 10/2007 | Tucker |
| 2007/0242497 A1 | 10/2007 | Joshi et al. |
| 2008/0067589 A1 | 3/2008 | Ito et al. |
| 2008/0108208 A1 | 5/2008 | Arevalo et al. |
| 2008/0138953 A1 | 6/2008 | Challa et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0203522 A1 | 8/2008 | Mandelman et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0003105 A1 | 1/2009 | Itoh et al. |
| 2009/0004806 A1 | 1/2009 | Siprak |
| 2009/0057746 A1 | 3/2009 | Sugll et al. |
| 2009/0057762 A1 | 3/2009 | Bangsaruntip et al. |
| 2009/0108350 A1 | 4/2009 | Cai et al. |
| 2009/0121298 A1 | 5/2009 | Furukawa et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2010/0012988 A1 | 1/2010 | Yang et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren |

| | | | |
|---|---|---|---|
| 2011/0294278 | A1 | 12/2011 | Eguchi et al. |
| 2011/0309447 | A1 | 12/2011 | Arghavani et al. |
| 2012/0021594 | A1 | 1/2012 | Gurtej et al. |
| 2012/0034745 | A1 | 2/2012 | Colombeau et al. |
| 2012/0056275 | A1 | 3/2012 | Cai et al. |
| 2012/0065920 | A1 | 3/2012 | Nagumo et al. |
| 2012/0108050 | A1 | 5/2012 | Chen et al. |
| 2012/0132998 | A1 | 5/2012 | Kwon et al. |
| 2012/0138953 | A1 | 6/2012 | Cai et al. |
| 2012/0146155 | A1 | 6/2012 | Hoentschel et al. |
| 2012/0167025 | A1 | 6/2012 | Gillespie et al. |
| 2012/0187491 | A1 | 7/2012 | Zhu et al. |
| 2012/0190177 | A1 | 7/2012 | Kim et al. |
| 2012/0223363 | A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |

OTHER PUBLICATIONS

US 7,011,991, 03/2006, Li (withdrawn).
Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.
Chau, R et al., "A 50nm Depleted-Substrate CMOS Transistor (DST)", Electron Device Meeting 2001, IEDM Technical Digest, IEEE International, pp. 29.1.1-29.1.4, 2001.
Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24, 1995.
Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.
Wann, C. et al., "Channel Profile Optimization and Device Design for Low-Power High-Performance Dynamic-Threshold MOSFET", IEDM 96, pp. 113-116, 1996.
Thompson, S et al., "MOS Scaling: Transistor Challenges for the 21st Century", Intel Technology Journal Q3' 1998, pp. 1-19, 1998.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.
Yan, Ran-Hong et al., "Scaling the Si MOSFET: From Bulk to SOI to Bulk", IEEE Transactions on Electron Devices, vol. 39, No. 7, Jul. 1992.
Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.
Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.
Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.
Holland, OW and Thomas, DK "A Method to Improve Activation of Implanted Dopants in SiC", Oak Ridge National Laboratory, Oak Ridge, TN, 2001.
Werner, P et al., "Carbon Diffusion in Silicon", Applied Physics Letters, vol. 73, No. 17, pp. 2465-2467, Oct. 1998.
Pinacho, R et al., "Carbon in Silicon: Modeling of Diffusion and Clustering Mechanisms", Journal of Applied Physics, vol. 92, No. 3, pp. 1582-1588, Aug. 2002.
Scholz, R et al., "Carbon-Induced Undersaturation of Silicon Self-Interstitials", Appl. Phys. Lett. 72(2), pp. 200-202, Jan. 1998.
Goesele, U et al., Diffusion Engineering by Carbon in Silicon, Mat. Res. Soc. Symp. vol. 610, 2000.
Ducroquet, F et al. "Fully Depleted Silicon-On-Insulator nMOSFETs with Tensile Strained High Carbon Content Sil-yCy Channel", ECS 210th Meeting, Abstract 1033, 2006.
Lavéant, P. "Incorporation, Diffusion and Agglomeration of Carbon in Silicon", Solid State Phenomena, vols. 82-84, pp. 189-194, 2002.
Ernst, T et al., "Integration of SiGe: C Alloys in Advanced CMOS".
Stolk, PA et al., "Physical Mechanisms of Transient Enhanced Dopant Diffusion in Ion-Implanted Silicon", J. Appl. Phys. 81(9), pp. 6031-6050, May 1997.
Scholz, RF et al., "The Contribution of Vacancies to Carbon Out-Diffusion in Silicon", Appl. Phys. Lett., vol. 74, No. 3, pp. 392-394, Jan. 1999.
Robertson, LS et al., "The Effect of Impurities on Diffusion and Activation of Ion Implanted Boron in Silicon", Mat. Res. Soc. Symp. vol. 610, 2000.
Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.
Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.
Wong, H et al., "Nanoscale CMOS", Proceedings of the IEEE, Vo. 87, No. 4, pp. 537-570, Apr. 1999.
Banerjee, et al. "Compensating Non-Optical Effects using Electrically-Driven Optical Proximity Correction", Proc. of SPIE vol. 7275 72750E, 2009.
Cheng, et al. "Extremely Thin SOI (ETSOI) CMOS with Record Low Variability for Low Power System-on-Chip Applications", Electron Devices Meeting (IEDM), Dec. 2009.
Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.
Drennan, et al. "Implications of Proximity Effects for Analog Design", Custom Integrated Circuits Conference, pp. 169-176, Sep. 2006.
Hook, et al. "Lateral Ion Implant Straggle and Mask Proximity Effect", IEEE Transactions on Electron Devices, vol. 50, No. 9, pp. 1946-1951, Sep. 2003.
Hori, et al., "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.
Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.
Shao, et al., "Boron Diffusion in Silicon: The Anomalies and Control by Point Defect Engineering", Materials Science and Engineering R: Reports, vol. 42, No. 3-4, pp. 65-114, Nov. 1, 2003.
Sheu, et al. "Modeling the Well-Edge Proximity Effect in Highly Scaled MOSFETs", IEEE Transactions on Electron Devices, vol. 53, No. 11, pp. 2792-2798, Nov. 2006.

* cited by examiner

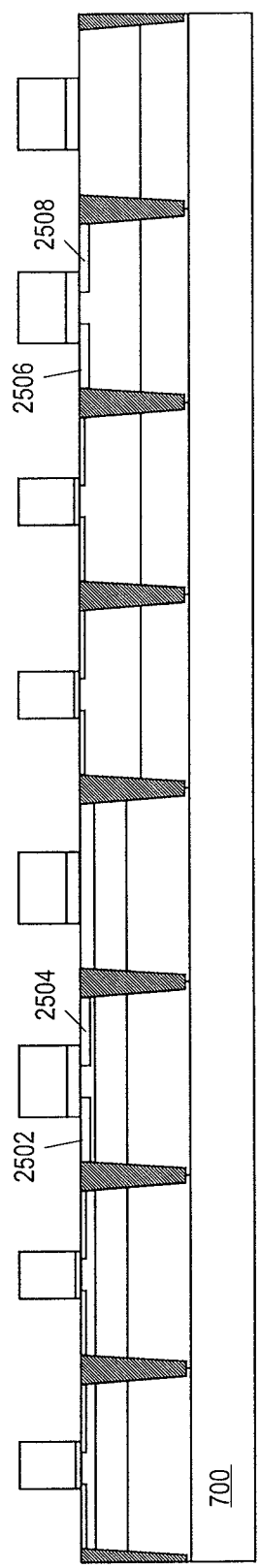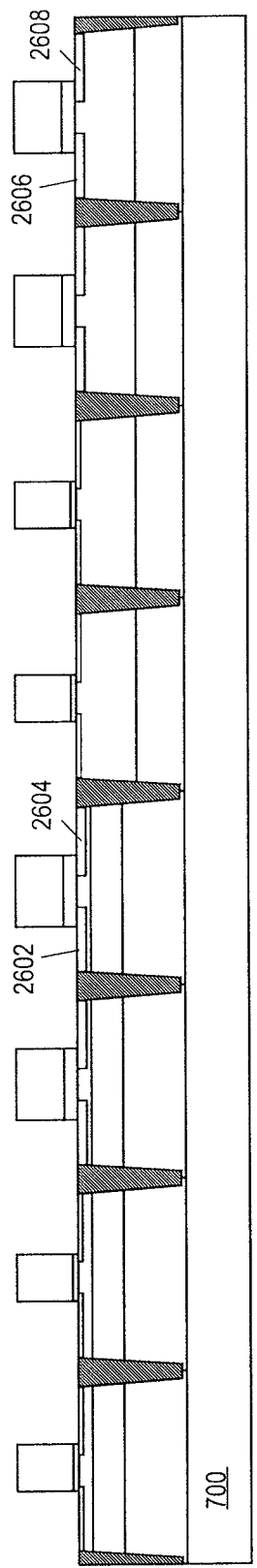

LOW POWER SEMICONDUCTOR TRANSISTOR STRUCTURE AND METHOD OF FABRICATION THEREOF

CROSS REFERENCE TO RELATED APPLICATIONS

This application claims the benefit of U.S. Provisional Application No. 61/323,255 filed Apr. 12, 2010 which is incorporated herein by reference.

TECHNICAL FIELD

This application relates in general to semiconductor devices and fabrication processes and more particularly to a low power semiconductor transistor structure and method of fabrication thereof.

BACKGROUND

For some time the semiconductor industry has been using bulk CMOS technology to make circuits in chips. Bulk CMOS technology has proven to be particularly "scalable," meaning that bulk CMOS transistors can be made smaller and smaller while optimizing and reusing existing manufacturing processes and equipment in order to maintain acceptable production costs. Historically, as the size of a bulk CMOS transistor decreased, so did its power consumption, helping the industry provide increased transistor density and lower operating power. Thus, the semiconductor industry has been able to scale the power consumption of bulk CMOS transistors with their size, reducing the cost of operating transistors and the systems in which they reside.

In recent years, however, decreasing the power consumption of bulk CMOS transistors while reducing their size has become increasingly more difficult. Transistor power consumption directly affects chip power consumption, which, in turn, affects the cost of operating a system and, in some cases, the utility of the system. For example, if the number of transistors in the same chip area doubles while the power consumption per transistor remains the same or increases, the power consumption of the chip will more than double. This is due in part by the need to cool the resulting chip, which also requires more energy. As a result, this would more than double the energy costs charged to the end user for operating the chip. Such increased power consumption could also significantly reduce the usefulness of consumer electronics, for example, by reducing the battery life of mobile devices. It could also have other effects such as increasing heat generation and the need for heat dissipation, potentially decreasing reliability of the system, and negatively impacting the environment.

There has arisen among semiconductor engineers a widespread perception that continued reduction of power consumption of bulk CMOS is not feasible, in part because it is believed that the operating voltage $V_{DD}$ of the transistor can no longer be reduced as transistor size decreases. A CMOS transistor is either on or off. The CMOS transistor's state is determined by the value of a voltage applied to the gate of the transistor relative to a threshold voltage $V_T$ of the transistor. While a transistor is switched on, it consumes dynamic power, which can be expressed by the equation:

$$P_{dynamic} = CV_{DD}^2 f$$

where $V_{DD}$ is the operating voltage supplied to the transistor, C is the load capacitance of the transistor when it is switched on, and f is the frequency at which the transistor is operated.

While a transistor is switched off, it consumes static power, which can be expressed by the equation:

$$P_{static} = I_{OFF} V_{DD}$$

where $I_{OFF}$ is the leakage current when the transistor is switched off. Historically, the industry has reduced transistor power consumption primarily by reducing the operating voltage $V_{DD}$, which reduces both dynamic and static power.

The ability to reduce the operating voltage $V_{DD}$ depends in part on being able to accurately set the threshold voltage $V_T$, but that has become increasingly difficult as transistor dimensions decrease. For transistors made using bulk CMOS processes, the primary parameter that sets the threshold voltage $V_T$ is the amount of dopants in the channel. Other factors that affect $V_T$ are halo implantation, source and drain low doped extensions, and channel thickness. In theory, matching transistor $V_T$ can be done precisely, such that the same transistors on the same chip will have the same $V_T$, but in reality the process and statistical variations in dopant concentration and placement mean that threshold voltages can vary significantly. Such mismatched transistors will not all switch on at the same time in response to the same gate voltage, and in extreme cases some may never switch on. Of even more concern, mismatched transistors result in increased leakage losses that waste power even when a transistor is not actively switching.

For transistors having a channel length of 100 nm or less, as few as thirty to fifty dopant atoms may be positioned in a channel at nominal dopant concentration levels. This compares with the thousands, or tens of thousands of atoms that are in positioned in the channel for previous generation transistors that have channel lengths greater than 100 nanometers or so. For nanometer scale transistors, the inherent statistical variation in numbers and placement of such few dopant atoms results in a detectable variation in $V_T$ known as random dopant fluctuations (RDF). Along with process and material variations, for nanometer scale bulk CMOS transistors with doped channel, RDF is a major determinant of variations in $V_T$ (typically referred to as sigma $V_T$ or $\sigma V_T$) and the amount of $\sigma V_T$ caused by RDF only increases as channel length decreases.

Processes and designs for novel transistors having greatly reduced $\sigma V_T$ are sought by the industry. However, many proposed solutions such as undoped channel FINFET would require substantial changes in transistor process manufacture and layout. This has slowed adoption, since the industry prefers to avoid redesigns that require substantial change in conventional and widely used integrated circuit manufacturing processes and transistor layout. This is particularly true for systems on chip (SoC) or other highly integrated devices that include a wide variety of circuit types, such as analog input and output circuits (I/O), digital circuits, and other types of circuits. Moreover, given the different types of circuits on such highly integrated systems, if one or more types of circuits can be improved, and any necessary legacy circuits remain the same, the overall SoC should still be produced together to avoid extra steps in the manufacturing process. For example, if an improvement to the digital circuits can be accomplished, and the improvement did not apply to analog circuits, it would be desirable to have the circuits to be manufactured together simultaneously without adding further processing steps. The entire integrated circuit can be redesigned to accommodate operation at the reduced voltage power source. As referenced herein, the term "redesign" can include appropriate sizing of transistor gates prior to circuit fabrication. However, difficulties are encountered when redesign attempts are made. Extra process and masking steps, can be complex, costly and technically difficult.

Given the substantial costs and risks associated with transitioning to a new technology, manufacturers of semiconductors and electronic systems have long sought a way to extend the use of bulk CMOS. At least in part due to the inability to easily control $\sigma V_T$ variation in groups of transistors as $V_{DD}$ is substantially reduced below one volt, the continued reduction of power consumption in bulk CMOS has increasingly become viewed in the semiconductor industry as an insurmountable problem.

SUMMARY

There is substantial advantage in having a low power digital transistor process and structure that permits on-die analog I/O transistors to remain unchanged even when low power transistors replace standard transistors. Thus, it is desirable to have a mix of circuits where some are changed and others are unchanged legacy circuits, but where the process to manufacture them is not substantially changed. And to reduce costs and increase yields, it would be best to not substantially increase the number of manufacturing steps in producing the overall integrated circuit.

Thus, there is a need in the art for improved structures and fabrication methods for complementary metal oxide semiconductor (CMOS) transistors and integrated circuits, and also a transistor fabrication process that is compatible with the fabrication of digital and analog transistors on a single integrated circuit die.

A suite of novel structures and methods is provided to reduce power consumption in a wide array of electronic devices and systems. Some of these structures and methods can be implemented largely by reusing existing bulk CMOS process flows and manufacturing technology, allowing the semiconductor industry as well as the broader electronics industry to avoid a costly and risky switch to alternative technologies. Some of the structures and methods relate to a Deeply Depleted Channel (DDC) design, allowing CMOS based devices to have a reduced $\sigma V_T$ compared to conventional bulk CMOS and can allow the threshold voltage $V_T$ of FETs having dopants in the channel region to be set much more precisely. The DDC design also can have a strong body effect compared to conventional bulk CMOS transistors, which can allow for significant dynamic control of power consumption in DDC transistors. There are many ways to configure the DDC to achieve different benefits, and additional structures and methods presented herein can be used alone or in conjunction with the DDC to yield additional benefits.

The disclosure describes various technical advantages over conventional semiconductor fabrication processing. One technical advantage is to provide a semiconductor structure that includes an analog device and a digital device each having an epitaxial channel layer. Another technical advantage is to have a single gate oxidation layer on the epitaxial channel layer of NMOS and PMOS transistor elements of the digital device and one of a double and triple gate oxidation layer on the epitaxial channel layer of NMOS and PMOS transistor elements of the analog device. Yet another technical advantage includes the use of a body bias to provide significant dynamic control of power consumption in DDC transistors. The result is the ability to independently control $V_T$ (with a low $\sigma V_T$) and $V_{DD}$, so that the body bias can be tuned separately from $V_T$ for a given device.

Certain embodiments of the present disclosure may enjoy some, all, or none of these advantages. Other technical advantages may be readily apparent to one skilled in the art from the following figures, description, and claims.

BRIEF DESCRIPTION OF THE DRAWINGS

For a more complete understanding of the present disclosure, reference is made to the following description taken in conjunction with the accompanying drawings, wherein like reference numerals represent like parts, in which:

FIGS. 7 through 30 show a series of steps in a process flow of an SoC having DDC digital transistors, digital legacy transistors, DDC analog transistors, and analog legacy transistors according to one embodiment.

DETAILED DESCRIPTION

Figure 1:
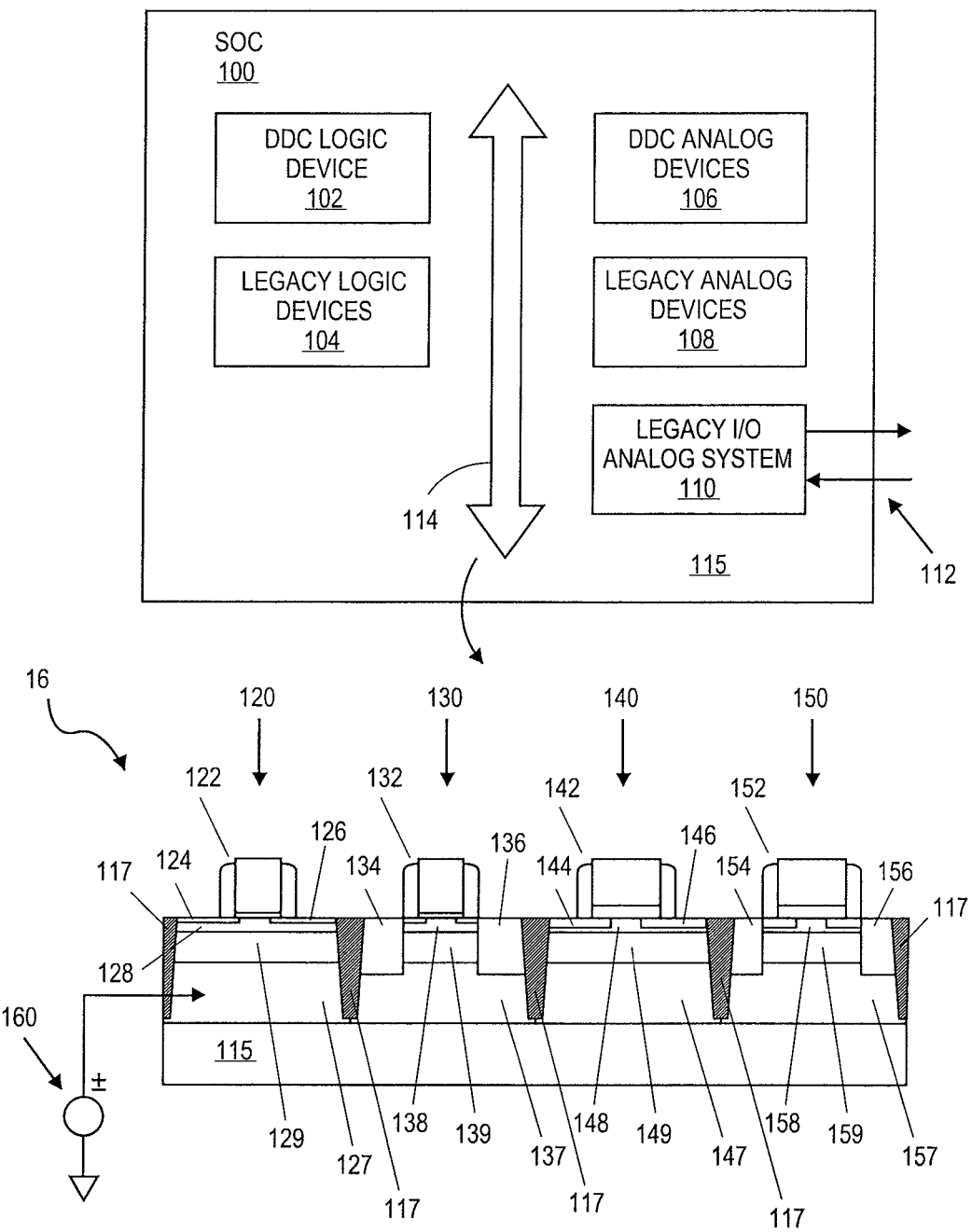
FIG. 1 shows a representative SoC with outlined groupings of DDC digital transistors, digital legacy transistors, DDC analog transistors, and analog legacy transistors, along with a respective profile.

Novel structures and methods are disclosed to reduce power consumption in a wide array of electronic devices and systems. Some of these structures and methods can be implemented largely by reusing existing bulk CMOS process flows and manufacturing technology, allowing the semiconductor industry as well as the broader electronics industry to avoid a costly and risky switch to alternative technologies. Different transistor designs, including both analog and digital transistors, can be incorporated into a single integrated circuit or system on a chip (SoC) for improved power saving benefits. Moreover, these new structures can be incorporated into the process flow together with legacy transistor and layout structures, reducing the risk to manufacturers of incorporating new structures in the process flow of an integrated circuit by avoiding extra process steps. As a result, there is little or no substantial increase in expense of production of integrated circuits, such as SoC, that incorporate the novel power saving transistor structures.

Also provided are methods and structures for incorporating and using the innovations described herein in systems, such as in electronic products, to provide substantial benefits over conventional devices as a result of lower power operation. Such benefits include lower power consumption at the system level, improved system performance, improved system cost, improved system manufacturability and/or improved system reliability as a result of cooler low power systems that may be designed and manufactured according to the embodiments described and illustrated herein. As will be demonstrated, the innovations can advantageously be employed in a wide range of electronic systems including consumer devices such as personal computers, mobile phones, televisions, digital music players, set top boxes, laptop and palmtop computing devices, e-book readers, digital cameras, GPS systems, flat panel displays, portable data storage devices and tablets, as well as in a variety of other electronic devices. In some implementations, the transistors and integrated circuits can materially enhance the operation and, accordingly, the commercial suitability, of the electronic system as a whole. In some embodiments, innovative transistors, integrated circuits and systems that contain them as described herein may also enable more environmentally friendly implementations than alternative approaches.

These and other benefits provide an advancement in digital circuits that fulfills many needs of designers, producers, and consumers. These benefits can provide systems composed of novel structures that enable continued and further advancement of integrated circuits, resulting in devices and systems with improved performance. The embodiments and examples will be described herein with reference to transistors, integrated circuits, electronic systems, and related methods, and will highlight the features and benefits that the novel structures and methods provide at various levels of the manufacturing process and the chain of commerce, including to end users of electronic products. The application of concepts inherent in these examples to structures and methods of producing integrated circuits and electronic systems will prove expansive. Accordingly, it will be understood that the spirit and scope of the inventions is not limited to these embodiments and examples, but is only limited by the claims appended herein and also in related and co-assigned applications.

In one embodiment, a novel nanoscale Field Effect Transistor (FET) structure is provided that has precisely controlled threshold voltage in comparison to conventional doped channel devices of the same channel length. In this context, precisely controlled threshold voltage includes the ability to set and possibly tune a $V_T$ value that provides significant improvement or reduction of $\sigma V_T$. This structure and methods of making it can allow FET transistors that have a low operating voltage as compared to conventional devices. One embodiment includes a nanoscale FET structure operable to have a depletion zone or region (i.e. deeply depleted channel, DDC) that extends from a gate to a highly doped screening layer set at a depth below the gate greater than one-half the gate length. In one embodiment, a channel region near the gate is substantially undoped as compared to a high concentration screening region located at a distance of at least ½ the gate length below the gate. This provides a substantially undoped channel region or layer (concentration of less than $5\times10^{17}$ atoms/cm³ and typically formed as an epitaxially grown silicon layer) paired with a highly doped screening region or layer. Together, in operation, these structures act to define a deeply depleted zone or region that terminates electric fields emanating from the gate when a voltage that is approximately equal to or greater than the threshold voltage is applied to the gate.

In certain embodiments the screening layer is positioned to avoid direct contact with the source and the drain. In certain other embodiments, it may be formed as a sheet extending under multiple source/drain/channel regions, while in other embodiments it may be a self aligned implant or layer coextensive with the channel region. The screening region thickness can typically range from 5 to 50 nanometers. The screening region is highly doped relative to the channel, the threshold voltage tuning region (if provided), and the P-well. In practice, the screening region is doped to have a concentration between $1\times10^{18}$ and $1\times10^{20}$ atoms/cm³. In certain embodiments, dopant migration resistant layers of carbon, germanium, or the like can be applied above screening region to prevent dopant migration toward the undoped channel and gate.

While threshold voltage is primarily set by the combination of gate work function, body bias, channel thickness, and depth and dopant concentration of the screening layer, small adjustments to threshold voltage are possible by optional provision of a separate epitaxially grown silicon layer adjacent to the screening region. Such a threshold voltage tuning region has a dopant concentration less than the dopant concentration of the screening region. For typical applications the threshold voltage tuning region is doped to have average concentrations ranging from between $5\times10^{17}$ and $2\times10^{19}$ atoms/cm³. When present, the threshold tuning region thickness can typically range from 5 to 50 nanometers in thickness. In certain embodiments, dopant migration resistant layers of carbon, germanium, or the like can be applied above and/or below the threshold voltage tuning region to prevent dopant migration into the channel region, or alternatively, from the screening region into the threshold voltage tuning region.

As will be appreciated, DDC depth ($X_d$) is established by the depth of the screening layer below the gate, and is typically one half of the gate length (i.e. ½ Lg), possibly equal to gate length (i.e. Lg) or to intermediate fractions thereabout (e.g. ¾ Lg). In one example, DDC depth may be set greater than or about equal to one-half the channel length Lg, which in operation allows for precise setting of the threshold voltage even at low operating voltages below one volt. Depending on the requirements of a particular application, different depths may provide different beneficial results. Given this disclosure, it will be understood that different DDC depths are possible in different applications, different device geometries, and various parameters of particular designs. Depending on the parameters of a particular application, different region thicknesses, dopant concentrations, and operating conditions used in forming the DDC transistor may provide different beneficial results.

As will be discussed, some of the structures and methods relate to a DDC design that can be produced together with legacy transistor devices in a monolithic circuit laid out on the same wafer and die. The DDC can permit CMOS devices having reduced $\sigma V_T$ compared to conventional bulk CMOS with highly doped channels, allowing for increased variability of $V_T$. The DDC design also can have a strong body effect compared to conventional bulk CMOS transistors, which can allow for improved body bias assisted control of transistor voltage threshold setting. There are many ways to configure the DDC to achieve different benefits, and additional structures and methods presented herein can be used alone or in conjunction with the DDC to yield additional benefits.

These structures and the methods of making the structures allow for FET transistors having both a low operating voltage and a low threshold voltage as compared to conventional nanoscale devices. Furthermore, DDC transistors can be configured to allow for the threshold voltage to be statically set with the aid of a voltage body bias generator. In some embodiments the threshold voltage can even be dynamically controlled, allowing the transistor leakage currents to be greatly reduced (by setting the voltage bias to upwardly adjust the $V_T$ for low leakage, low speed operation), or increased (by downwardly adjusting the $V_T$ for high leakage, high speed operation). Ultimately, these structures and the methods of making structures provide for designing integrated circuits having FET devices that can be dynamically adjusted while the circuit is in operation. Thus, transistors in an integrated circuit can be designed with nominally identical structure, and can be controlled, modulated or programmed to operate at different operating voltages in response to different bias voltages, or to operate in different operating modes in response to different bias voltages and operating voltages. In addition, these can be configured post-fabrication for different applications within a circuit.

Certain embodiments and examples are described herein with reference to transistors and highlight the features and benefits that the novel structures and methods provide transistors. However, the applicability of concepts inherent in these examples to structures and methods of producing integrated circuits is expansive and not limited to transistors or bulk CMOS. Accordingly, it will be understood in the art that the spirit and scope of the inventions is not limited to these embodiments and examples or to the claims appended herein and also in related and co-assigned applications, but may be advantageously applied in other digital circuitry contexts.

In the following description, numerous specific details are given of some of the preferred ways in which the inventions may be implemented. It is readily apparent that the inventions can be practiced without these specific details. In other instances, well known circuits, components, algorithms, and processes have not been shown in detail or have been illustrated in schematic or block diagram form in order not to obscure the inventions in unnecessary detail. Additionally, for the most part, details concerning materials, tooling, process timing, circuit layout, and die design have been omitted inasmuch as such details are not necessary to obtain a complete understanding of the inventions as they are considered to be within the understanding of persons of ordinary skill in the relevant art. Certain terms are used throughout the following description and claims to refer to particular system components. Similarly, it will be appreciated that components may be referred to by different names and the descriptions herein are not intended to distinguish between components that differ in name but not function. In the following discussion and in the claims, the terms "including" and "comprising" are used in an open-ended fashion, and thus should be interpreted to mean "including, but not limited to," for example.

Various embodiments and examples of the methods and structures mentioned above are described herein. It will be realized that this detailed description is illustrative only and is not intended to be in any way limiting. Other embodiments will readily suggest themselves to persons of ordinary skill in the art having the benefit of this disclosure. Reference will be made in detail to embodiments illustrated in the accompanying drawings. The same reference indicators will be used throughout the drawings and the following detailed description to refer to the same or like parts.

In the interest of clarity, not all of the routine features of the implementations and embodiments described herein are shown and described. It will, of course, be appreciated that in the development of any such actual implementation of the inventions herein, numerous implementation-specific decisions will typically be made in order to achieve the developer's specific goals. Moreover, it will be appreciated that such a development effort might be complex and time-consuming, but would nevertheless be a routine undertaking of engineering for those of ordinary skill in the art having the benefit of this disclosure.

Also, concentrations of atoms implanted or otherwise present in a substrate or crystalline layers of a semiconductor to modify physical and electrical characteristics of a semiconductor will be described in terms of physical and functional regions or layers. These may be understood by those skilled in the art as three-dimensional masses of material that have particular averages of concentrations. Or, they may be understood as sub-regions or sub-layers with different or spatially varying concentrations. They may also exist as small groups of dopant atoms, regions of substantially similar dopant atoms or the like, or other physical embodiments. Descriptions of the regions based on these properties are not intended to limit the shape, exact location or orientation. They are also not intended to limit these regions or layers to any particular type or number of process Steps, type or numbers of layers (e.g., composite or unitary), semiconductor deposition, etch techniques, or growth techniques utilized. These processes may include epitaxially formed regions or atomic layer deposition, dopant implant methodologies or particular vertical or lateral dopant profiles, including linear, monotonically increasing, retrograde, or other suitable spatially varying dopant concentration. The embodiments and examples included herein may show specific processing techniques or materials used, such as epitaxial and other processes described below and illustrated in FIGS. 7-30. These examples are only intended as illustrative examples, and are not nor should they be construed as limiting. The dopant profile may have one or more regions or layers with different dopant concentrations, and the variations in concentrations and how the regions or layers are defined, regardless of process, may or may not be detectable via techniques including infrared spectroscopy, Rutherford Back Scattering (RBS), Secondary Ion Mass Spectroscopy (SIMS), or other dopant analysis tools using different qualitative or quantitative dopant concentration determination methodologies.

In one embodiment, a building block for low power circuits can be configured with low power transistors, such as for example a low power field effect transistor as provided herein that is operable at a voltage $V_{dd}$ of less than 0.9 volts. In one example, the transistor may include a polysilicon gate with a gate length less than 100 nanometers, where the gate includes a polysilicon layer and a dielectric layer. The device further includes a low doped epitaxial channel contacting the dielectric layer of the polysilicon gate. A highly doped screening layer may be positioned in a manner to extend below low doped epitaxial channel and above a transistor body. The screening layer may be treated to reduce dopant diffusion into the low doped epitaxial channel, as discussed in more detail below. The device includes a source and a drain, with a low doped epitaxial channel extending between the source and drain.

In certain embodiments, a body tap may also be included to permit application of a body bias voltage to the transistor body. Body biasing relies on the body effect phenomenon to modulate the $V_T$ of a MOSFET, and is commonly quantified as a body effect coefficient. As will be appreciated, forward biasing (FBB) the body with respect to the source reduces $V_T$, increasing transistor speed. However, because of the exponential dependence of leakage on $V_T$, it also leads to a large increase in power usage. Similarly, reverse body bias (RBB) reduces leakage at the cost of reduced speed and increased delay. In certain embodiments, application of a body bias permits increase of threshold voltage $V_T$ to a value greater than 0.3 volts for example.

Body taps, schematically illustrated as a connection between a body bias generator and a transistor body, may be applied to individual devices, groups of devices, or entire circuits or sub-circuits on a given integrated circuit depending on the application. According to these embodiments, improved $\sigma V_T$ allows for a stronger body bias coefficient, that in turn allows for improved changes in $V_T$. In prior art systems, body bias coefficient was improved by highly doping the channel, which resulted in a wide and undesirable range of $\sigma V_T$. Thus, a high threshold voltage was required for such devices to operate with body bias mediated control. According to the embodiments described herein, devices, systems and methods are provided that allow for greatly improved $\sigma V_T$, and also provide improved and strong body bias coefficient. Thus, a wide range of adjustable $V_T$ is possible with a strong body bias, resulting in a better performing device and system that operates at lower power.

FIG. 1 shows an exemplary SoC 100 configured with several diverse digital and analog transistor configurations that can be incorporated into a device using the methods described herein. According to the methods and processes discussed herein, a system having a variety of combinations of novel and legacy transistor devices and structures can be produced on silicon using bulk CMOS. The SoC 100 includes DDC digital logic devices 102, legacy digital logic devices 104, DDC analog devices 106, legacy analog devices 108, and legacy input and output (I/O) analog circuits and systems 110, and possibly other devices, which may be interconnected to each other within the circuit via a common bus 114, wire traces (not shown), or other interconnections 112. The devices are formed or otherwise processed as bulk CMOS on a common substrate 115, typically silicon or other similar substrate.

The SoC 100 includes at least one or more devices 106 that have DDC cross-section profiles, an example of which is shown here as a variety of both analog and digital transistors 120, 130, 140, 150, all of which can be formed together on substrate 115. The first device 120 is a digital transistor having a gate stack 122 and spacers, source and drain 124/126, a shallow well 127 (or body of the transistor) underneath a deeply depleted channel 128 and screening layer 129 that extends between the shallow trench isolated (STI) structures 117. The significance of this profile is the low power characteristic possible by this and other devices by virtue of the deeply depleted channel and screening layer. Another digital device 130 has a gate stack 132 and spacers, source and drain 134/136 and a shallow well 137 underneath a deeply depleted channel 138. Unlike device 120, this digital device 130 has a screening layer 139 that, along with DDC 138, extends between the source and drain 134/136. Like device 120, the significance of this profile is the low power characteristic possible by this and other devices by virtue of the deeply depleted channel and screening layer.

The third and fourth devices from the left are analog devices that share some of the physical characteristics of the digital devices in their channel regions, providing power saving features for these and other similar analog devices. Analog device 140 is a digital transistor having a gate stack 142 and spacers, source and drain 144/146, a shallow well 147 underneath a deeply depleted channel 148 and screening layer 149 that extends between the STI Structures 117. Like the digital devices described above, the significance of this analog device profile is that the low power characteristic possible by this and other analog devices by virtue of the deeply depleted channel and screening layer. Another analog device 150 has a gate stack 152 and spacers, source and drain 154/156 and a shallow well 157 underneath a deeply depleted channel 158. Unlike device 140, this digital device 150 has a screening layer 159 that, along with DDC 158, extends between the source and drain 154/156. Like device 140, the significance of this profile is the low power characteristic possible by this and other devices by virtue of the deeply depleted channel and screening layer.

In some applications, there may be the desire to apply a bias voltage to the body 127 of the transistor, such as bias voltage source 160 shown in FIG. 1. According to one embodiment, the $V_T$ of a given device or multiple devices may be dynamically set by applying a bias voltage to the body. Thus, and again, body taps, schematically illustrated as a connection between bias voltage source 160 and a transistor, may be applied to individual devices, groups of devices, or entire circuits or sub-circuits on a given integrated circuit depending on the application. According to these embodiments, improved $\sigma V_T$ allows for a stronger body bias coefficient that allows for improved changes in $V_T$.

Figure 2:
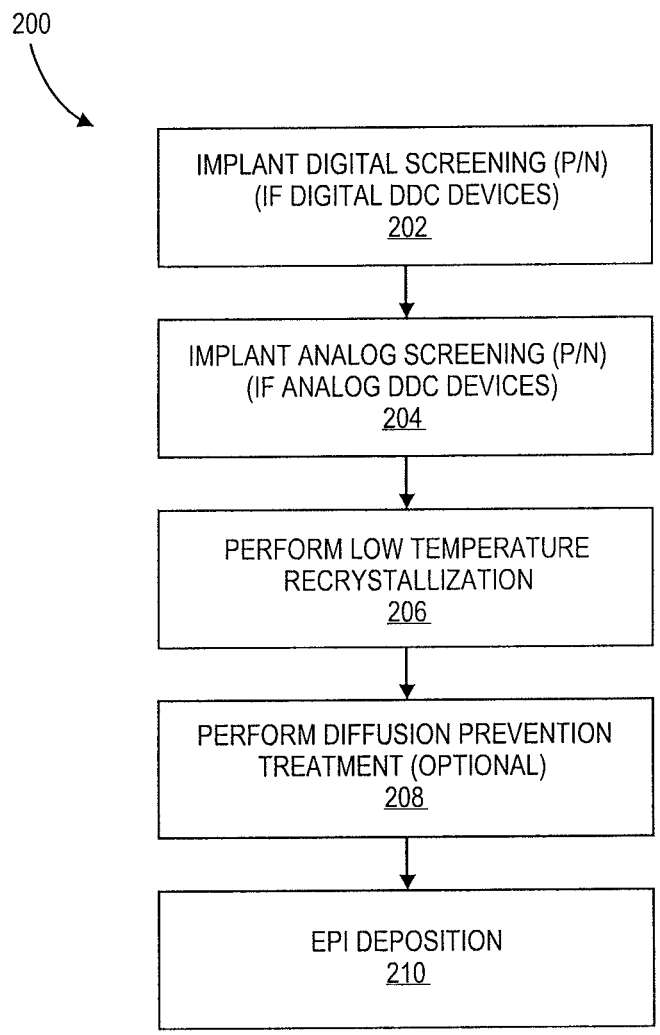
FIG. 2 is a general flow chart showing different process steps related to processing DDC analog and digital devices.

Referring to FIG. 2, a brief process flow chart 200 for producing DDC structures for analog and digital device is illustrated. These along with other process Steps allow for the processing and manufacture of integrated circuits that include DDC structured devices together with legacy devices, allowing for designs to cover a full range of analog and digital devices with improved performance and lower power. And, the novel structures can be formed together with legacy devices using well known processing techniques and design rules. In the first Step 202, if digital DDC devices are included in a process, a digital screen is implanted for both P-type and N-type devices. In the next Step, 204, if analog DDC type devices are included, analog screening is performed for both P-type and N-type analog DDC devices.

In practice, amorphizing silicon is performed to assisting in the activation and substitutionality of dopants. Since amorphous silicon cannot grow epitaxial layers, it must be returned to a crystalline state. So, in Step 206, low temperature re-crystallization is performed.

In Step 208, an optional Step of diffusion prevention may be performed. It is noted here that steps for preventing diffusion of dopants can be used along with different steps while manufacturing integrated circuits. Since undesired diffusion of dopants may occur at one or a number of steps in a given process flow, a designer may find it useful to perform diffusion prevention steps before, during or after any number of steps during circuit processing.

Epitaxial (EPI) deposition is then performed in Step 210. These Steps together with other Steps that are known in the art of semiconductor processing provide a novel and useful means to produce improved integrated circuits and SoC with improved and low power structures.

Figure 3:
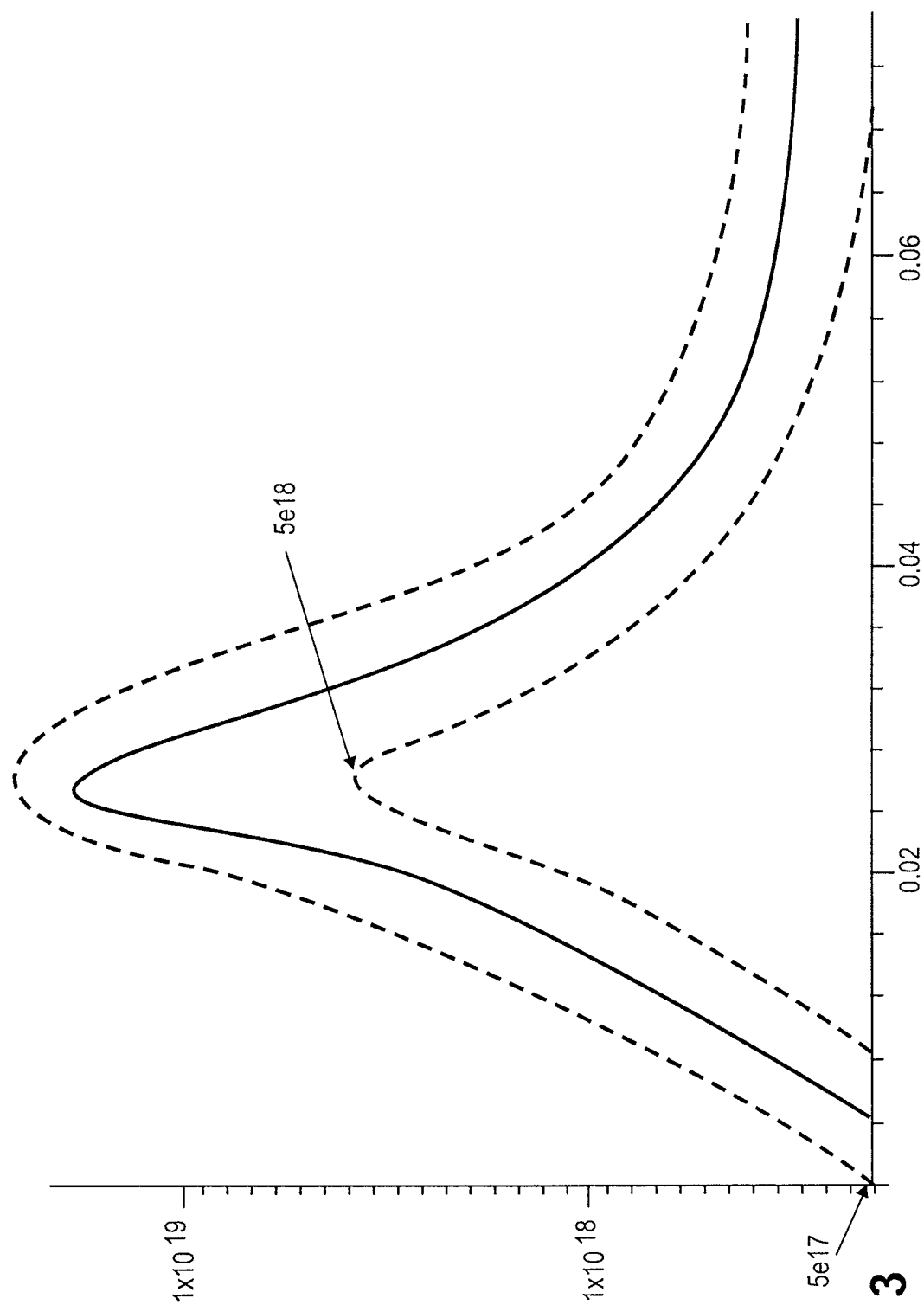
FIG. 3 is an example of a transistor dopant profile illustrating ranges of dopants according to different embodiments.

Referring to FIG. 3, a graph is shown with a range of different dopant profiles according to one embodiment. These ranges illustrated and the parameters set out are intended as examples, and those skilled in the art will understand that the benefits of the embodiments described and illustrated herein are attainable generally about or within those ranges.

In practice, designers and manufacturers gather statistical data from mathematical models and sample measurements from actual circuits to determine the variance of threshold voltages of a circuit design. The voltage differential mismatch between transistors, whether derived from manufacturing variations or RDFs, is determined as $\sigma V_T$. In order for the circuit as a whole to operate, the operating voltage $V_{DD}$ must be chosen in view of $\sigma V_T$. Generally the larger the variance, the higher the $\sigma V_T$, such that the operating voltage $V_{DD}$ must be set higher for the transistor to operate properly. With multiple device implemented across a circuit, $V_{DD}$ may need to be set at the highest overall value in order for the circuit to operate properly.

A structure and method of its production are provided that reduces $\sigma V_T$, reducing the range of variance of the threshold voltage of the transistors across the integrated circuit. With reduced $\sigma V_T$, the static value of $V_T$ can be set more precisely and can even be varied in response to a changing bias voltage. The threshold voltage for nominally identical devices across a circuit may be more accurately set with decreased $\sigma V_T$, thus allowing the device to operate using a lower operating voltage $V_{DD}$ and, therefore, consume less power. Moreover, with more headroom to vary $V_T$ for a given transistor or group of transistors, devices can be operated at different modes corresponding to different bias voltages for particular modes. This may add functionality to many devices and systems and may particularly benefit devices where fine control of device power modes is useful.

Figure 4:
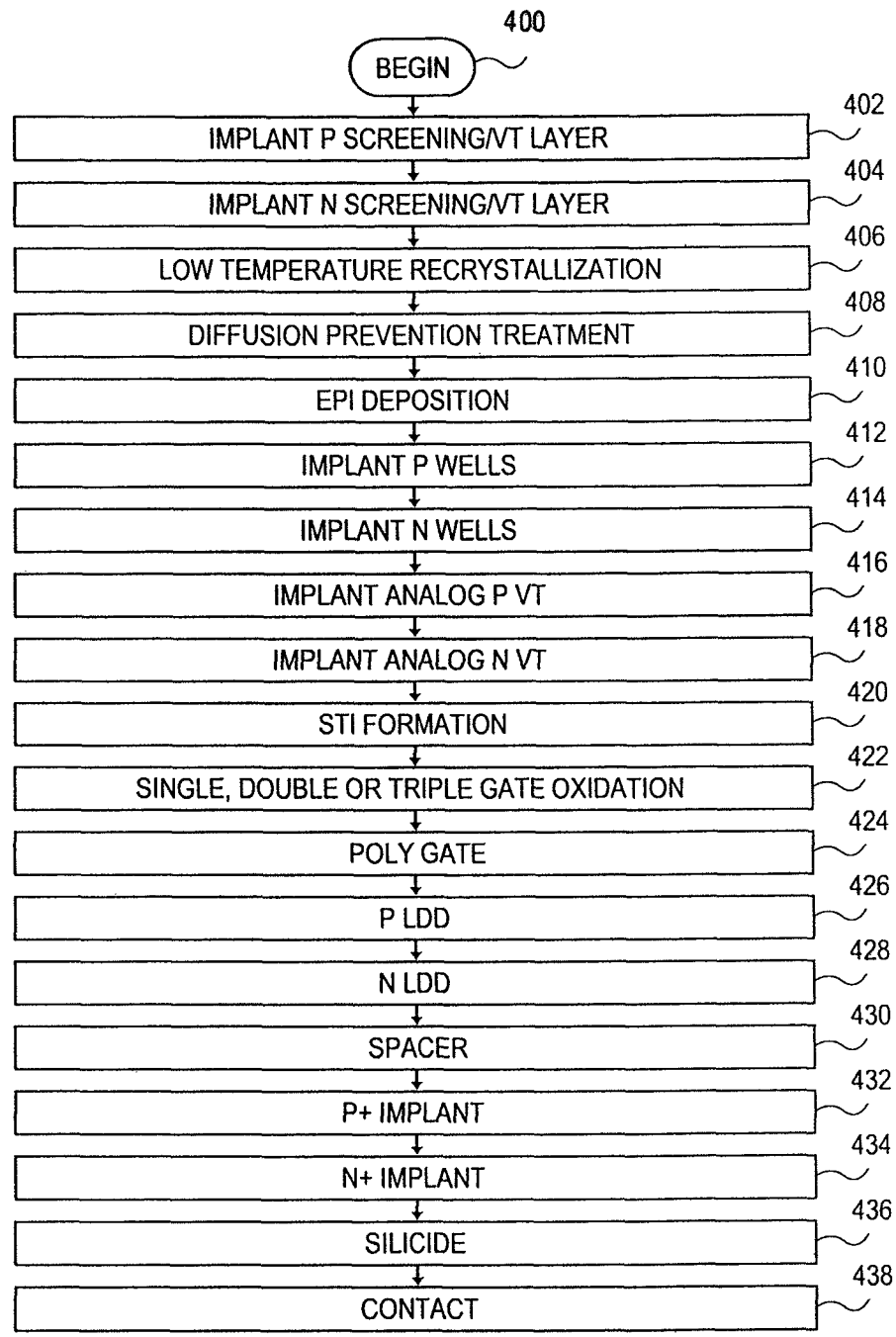
FIG. 4 is a flow chart showing one embodiment of an integrated circuit process flow.

Referring to FIG. 4, one example of a production process for an integrated circuit, such as a SoC, is illustrated in a process flow chart 400. In the first Step 402, a P-type screening layer is formed, possibly by implant, which may act as a screening or $V_T$ setting layer for a device in the integrated circuit. Next in Step 404, an N-type screening layer is formed, possibly by implant, which may act as a screening or $V_T$ setting layer for another device in the integrated circuit. In Step 406, a low temperature re-crystallization is performed.

In Step 408, a diffusion prevention treatment is performed. While dopants can be implanted or co-deposited during epitaxial growth, further high temperature processing can promote dopant diffusion through the silicon lattice. High temperature process steps required to form transistor structures can result in dopant atoms moving from a screening layer into the previously undoped channel, or even migrate into a gate oxide. There are several methods provided herein to address the prevention of dopant diffusion in different process flows, such as for example when thermal annealing procedures are performed in a process.

In one method, carbon can be introduced into the screening via implant or the growth of a silicon carbide (SiC) epitaxial layer. During annealing for example, substitutional carbon traps (via a kick-out mechanism) any mobile carriers such as boron or phosphorus. The addition of carbon helps to prevent diffusion during the high thermal cycles a polysilicon gate transistor typically experiences.

Indium is known to form a cluster with boron which is not mobile. However, this also leads to low dopant activation of boron. Thus, methods to achieve both high activation and low diffusion include the co-implantation of indium and boron. Several examples are included herein, and others are possible given this disclosure, including these examples and other processes used together in different combinations. In one exemplary process, co-implantation of indium and boron can be performed such that their peaks align. Different ratios between the peaks of indium and boron along with anneal options such as Flash and Laser will result in high concentration and sharp profiles. In another example, co-implantation of indium and boron can be performed such that the peak of indium is closer to the surface then boron. Boron diffusing to the surface will be slowed by the indium while the screening and $V_T$ layer will achieve high activation. In yet another example, co-implantation of indium and born can be performed such that the peak of the indium is closer to the substrate then the boron. This will prevent indium from diffusing into the substrate allowing high concentration to exist in the screening layer.

While carbon is useful in preventing migration of boron or other dopants, carbon itself may migrate into the undoped channel, increasing scattering and reducing channel mobility. To prevent carbon diffusion, the following procedure can be useful. If carbon and boron are co-implanted into amorphous silicon, a low temperature anneal may be used to re-grow the silicon layer. During this low temperature anneal, carbon re-grows substitutionally. This is because, when a process begins with crystal on silicon, it needs to be made amorphous, or amorphized, for processing so that is no longer in a crystalline state. It must then after be annealed to place it back in the crystalline state, or re-crystallized. Re-growth of crystal on silicon from the amorphous state can then be achieved. With carbon located in interstitial locations in the crystal lattice, carbon will substitute silicon atoms in the lattice. Thus, carbon re-grows substitutionally.

This re-growth results in a large concentration of silicon interstitials. With subsequent anneals, these interstitials diffuse rapidly towards the surface and pull boron from the screening region into the channel region. Additionally, the substitutional Carbon becomes interstitial via a kick-out mechanism which retards the boron diffusion. This interstitial carbon also diffuses towards the surface and would normally cause mobility degradation of the channel and create undesired surface states.

However, in this process embodiment, as the boron, excess interstitials and carbon move to the surface, a high temperature anneal followed by oxidation or a high temperature oxidation acts to consume boron, carbon and interstitial concentration that have moved to the surface. The oxidation process will create additional interstitials, so this oxidation needs to be thin (~2 nm). The oxide is then stripped and the undoped silicon channel is epitaxially grown on the contamination free surface. The undoped epi has reduced exposure to the mobile carbon and boron which has been removed from the system via the oxide growth and strip. Additionally, a similar oxidation can be used after the EPI growth before the gate oxidation. This additional oxidation can be in addition to the first oxidation or instead of the first oxidation.

During implantation, significant damage is introduced into the silicon. The resulting interstitials assist the Boron in diffusing quickly. According to one embodiment, by removing the implant damage, the interstitials can be eliminated allowing for less diffusion and more abrupt junctions. Two methods of achieving this are plasma implantation and doped spin on glass. In a spin on glass process, a high dose of silicon dioxide is placed on the surface of the silicon. For plasma implantation, a high dose of highly doped plasma is deposited on the surface. Here, there is no penetration or deposition into the substrate, no implantation occurs. When annealed, dopants are drawn in at the solid solubility, where the higher temperature causes a higher solid solubility. Dopants can then be affected by thermally annealing to draw in more dopants without damaging the silicon structure. The result is a higher doping achieved with abrupt junctions, and damage to the silicon is greatly reduced.

In one embodiment, SiGe can be used to slow the diffusion of boron from the screening layer into the channel. SiGe can be deposited on top of the substrate. Dopants can be implanted in the substrate or directly co-deposited during epitaxial growth of the SiGe layer. A Si layer is still deposited as the channel. The SiGe prevents diffusion from these doped layers into the Si channel.

Delta doping of C/N/Ge/Cl/F can be used at the interface between the screening layer and the EPI layer. This layer serves to prevent dopant diffusion across the layer. This layer also minimizes the amount of dopant in the system that could diffuse into the channel of the device or segregate into the gate.

Source/drain and source/drain extensions may incur damage from the formation of the DDC channel area. Due to polysilicon requiring both deep implants and high thermal anneals to prevent poly depletion, damage and dopants introduced to the channel area via lateral straggle can create large diffusion from the DDC channel stack into the channel (via interstitials or co-diffusion effects). As poly depletion effects cannot be sacrificed, there is no way to lower the implant energy/dose or the anneal criteria. Two methods to keep channel doping from getting to the DDC channel stack is the use of RSD and secondary spacers.

A second spacer can be used to increase the lateral distance from the SD implant and the DDC channel dose to prevent damage to silicon when implanting dopants. This spacer may or may not be removed after the SD implant and before salicidation. With increased lateral Si between the Si and the DDC channel, there is a decrease in the effect of lateral straggle.

Referring again to FIG. 4, the next Step after diffusion prevention treatment is EPI deposition in Step 410. Next, in Steps 412 and 414 respectively, P-wells and N-wells are implanted. Next, in Steps 416 and 418 respectively, analog P-type and N-type $V_T$ layers are implanted. STIs are then formed in Step 420 to separate the different devices from each other down to the shallow wells.

Next—depending on the type of device—single, double or triple gate oxidation is performed in Step 422. In practice, digital devices require only a thin single gate oxide layer, where analog devices have thicker double or triple gate oxide layers.

In Step 424, a polysilicon (polygate) layer is formed, followed by P-type Lightly Doped Drain (LDD) formed in Step 426, and N-type LDD formed in Step 428. These LDD, or tips, extend under the gate spacers.

Spacers are formed in Step 430. P+ and N+ implants are then performed in Steps 432 and 434. Silicide is then processed in Step 436, followed by contacts formed in Step 438.

Figure 5:
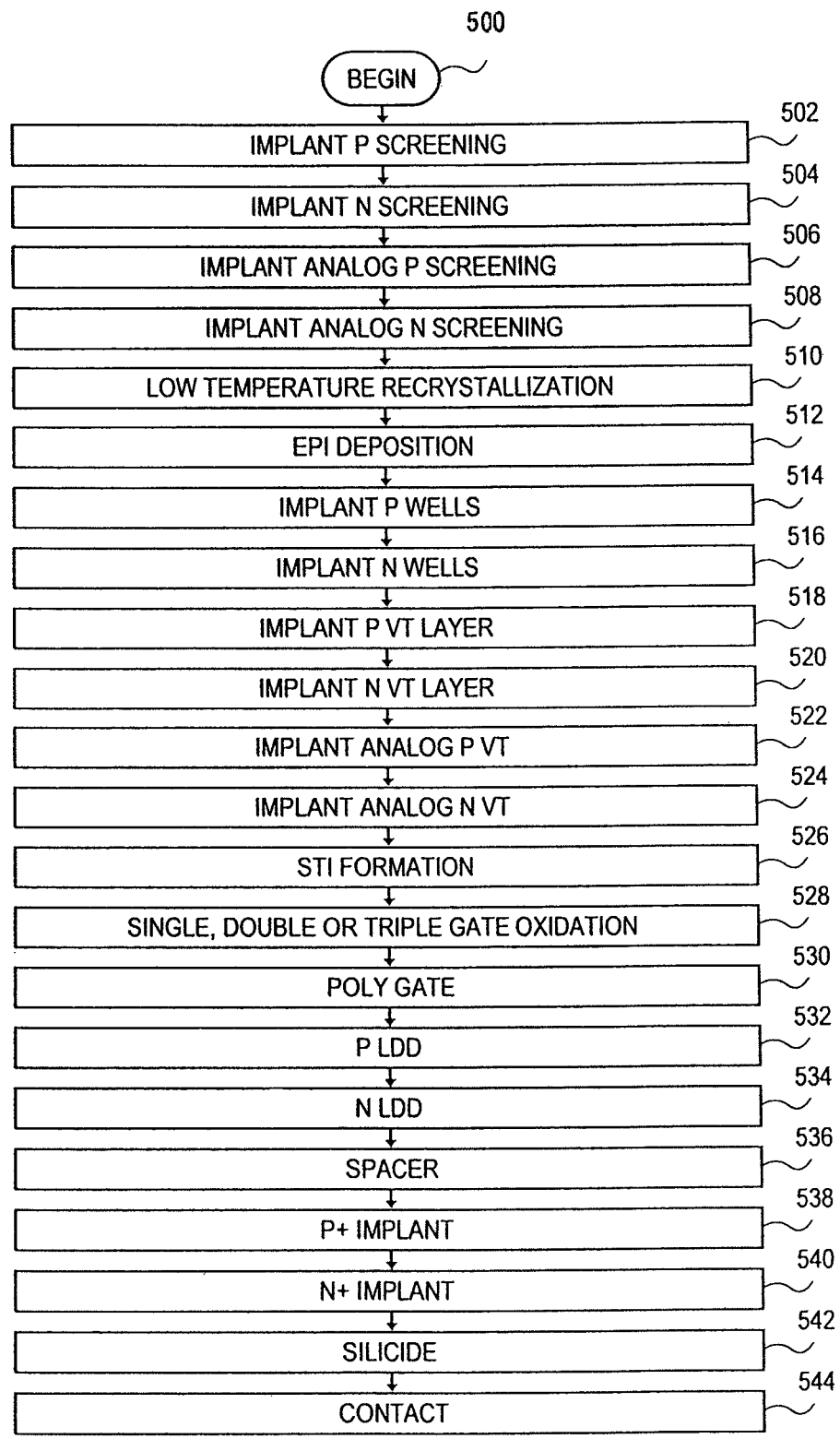
FIG. 5 is a flow chart showing one embodiment of an integrated circuit process flow.

Referring to FIG. 5, one example of a production process for an integrated circuit, such as a SoC, is illustrated in a process flow chart 500. In the first Step 502, a P-type screening layer is formed, possibly by implant, which may act as a screening or $V_T$ setting layer for a device in the integrated circuit. Next in Step 504, an N-type screening layer is formed, possibly by implant. In Step 506, a P-type analog screening layer is implanted, followed by an N-type analog screening layer implanted in Step 508. A low temperature re-crystallization is then performed in Step 510.

Next, in Step 512, EPI deposition is performed. In Steps 514 and 516 respectively, P-wells and N-wells are implanted. In Steps 518 and 520 respectively, P-type and N-type $V_T$ layers are implanted. In steps 522 and 524, analog P-type and N-type $V_T$ layers are implanted. STIs are then formed in Step 526 to separate the different devices from each other down to the shallow wells.

Next—depending on the type of device—single, double or triple gate oxidation is performed in Step 528. In practice, digital devices require only a thin single gate oxide layer, where analog devices have thicker double or triple gate oxide layers. In Step 530, a polygate layer is formed, followed by P-type LDD formed in Step 532, and N-type LDD formed in Step 534. Spacers are formed in Step 536. P+ and N+ implants are then performed in Steps 538 and 540. Silicide is then processed in Step 542, followed by contacts formed in Step 544.

Figure 6:
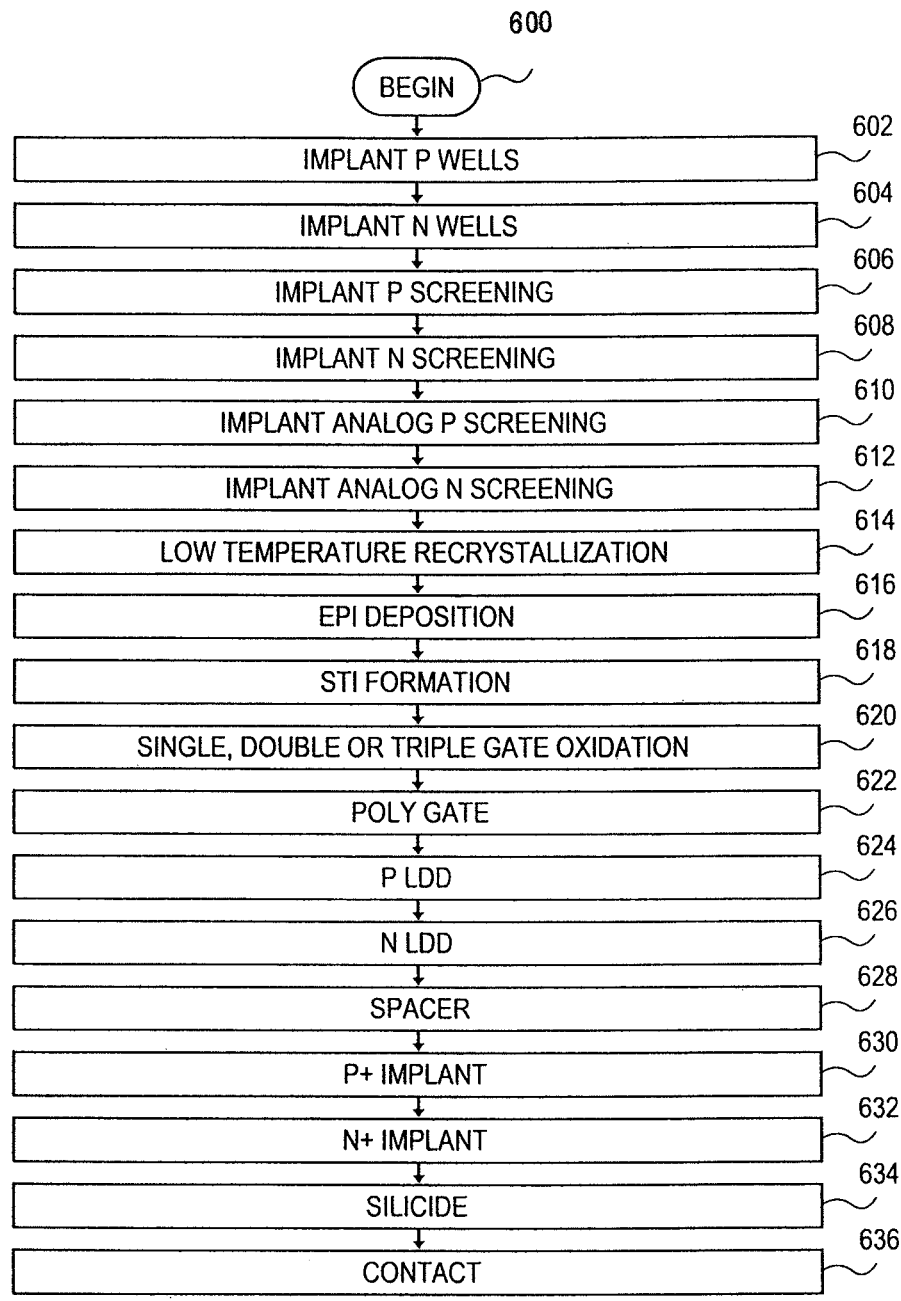
FIG. 6 is a flow chart showing one embodiment of an integrated circuit process flow.

Referring to FIG. 6, one example of a production process for an integrated circuit, such as a SoC, is illustrated in a process flow chart 600. In the first Step 602, P-type shallow wells are formed, possibly by implant. Next in Step 604, P-type shallow wells are formed, possibly by implant. In Steps 606 and 608, P-type and N-type screening layers are formed, possibly by implant. Next, in steps 610 and 612, P-type and N-type analog screening layers are formed, possibly by implant. In Step 614, a low temperature re-crystallization is performed. Epitaxial (epi) deposition is performed in Step 616. STIs are then formed in Step 618 to separate the different devices from each other down to the shallow wells.

Next—depending on the type of device—single, double or triple gate oxidation is performed in Step 620. In practice, digital devices require only a thin single gate oxide layer, where analog devices have thicker double or triple gate oxide layers.

In Step 622, a polysilicon gate (polygate) layer is formed, followed by P-type LDD formed in Step 624, and N-type LDD formed in Step 626. Spacers are formed in Step 628. P+ and N+ implants are then performed in Steps 630 and 632. Silicide is then processed in Step 634, followed by contacts formed in Step 636.

Referring to FIGS. 7-30 collectively, one example of a process configured for improved power savings is shown in a process profile diagram. The process starts with a silicon wafer 700, which is typically used to form multiple integrated circuits thereon. FIGS. 7-30 will show one example of the processing of several different circuit components by way of a progressive series of cross-sections of a silicon wafer. There is cross-over and removal of different structures as the process progresses, where some of the structures are substituted or otherwise eliminated. Accordingly, labels in the progressive figures will necessarily be eliminated, thus not all numbering labels will not be shown in all figures through to the end. This example will illustrate component devices including a PMOS DDC logic transistor, an NMOS DDC logic transistor, a PMOS DDC analog transistor, an NMOS DDC analog transistor, a PMOS legacy logic transistor, an NMOS legacy logic transistor, a PMOS legacy analog transistor and an NMOS legacy logic transistor. Those skilled in the art will understand that different combinations and permutations of these and other devices are possible given the examples described herein, and also that the following example is merely for illustrative purposes.

Figure 7:
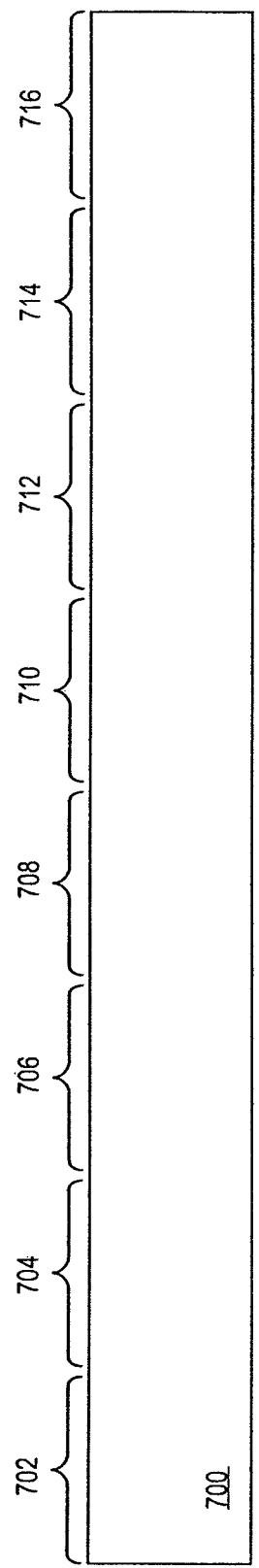

FIG. 7 a substrate 700, such as silicon. This process will illustrate exemplary process steps for forming eight different devices in this order beginning from the left and ordered to the right of this series of figures:

a PMOS DDC digital logic device 702;
an NMOS DDC digital logic device 704;
a PMOS DDC analog device 706;
an NMOS DDC analog device 708;
a PMOS legacy digital logic device 710;
an NMOS legacy digital logic device 712;
a PMOS legacy analog device 714; and
an NMOS legacy analog device 716.

Figure 8:
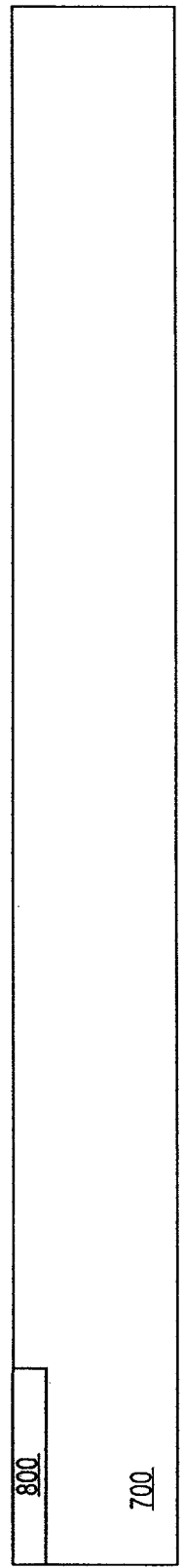

FIG. 8 shows an implanted N-type doping screening layer 800 formed for a PMOS DDC logic device on the substrate 700.

Figure 9:

FIG. 9 shows a P type doping screening layer 900 formed for a NMOS DDC logic device on substrate 700 for another device.

Figure 10:
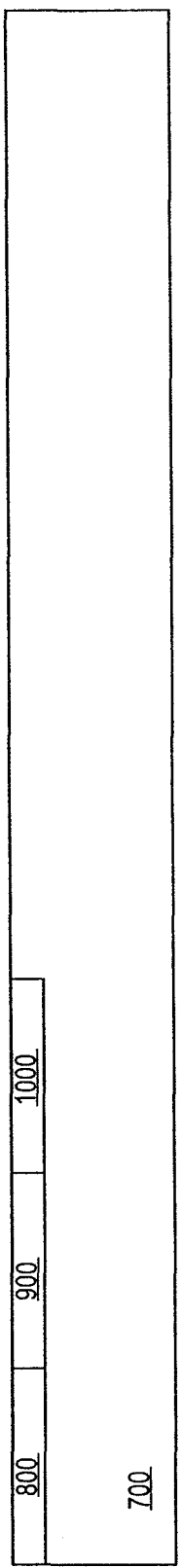

FIG. 10 shows an implanted Analog N-type screening layer 1000 for a PMOS DDC analog device.

Figure 11:
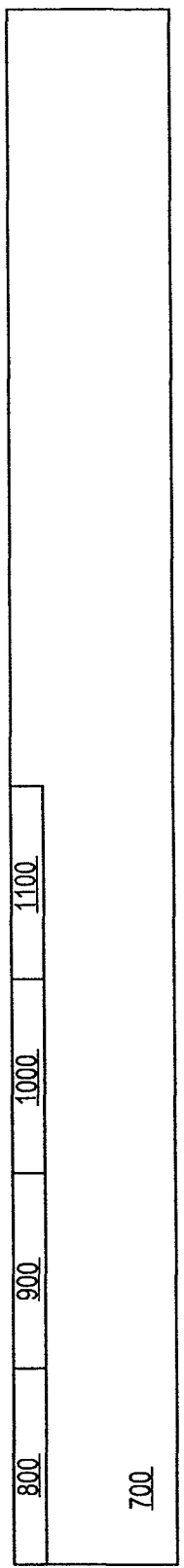

FIG. 11 shows an implanted Analog P-type screening layer 1100 for an NMOS DDC analog device.

Figure 12:
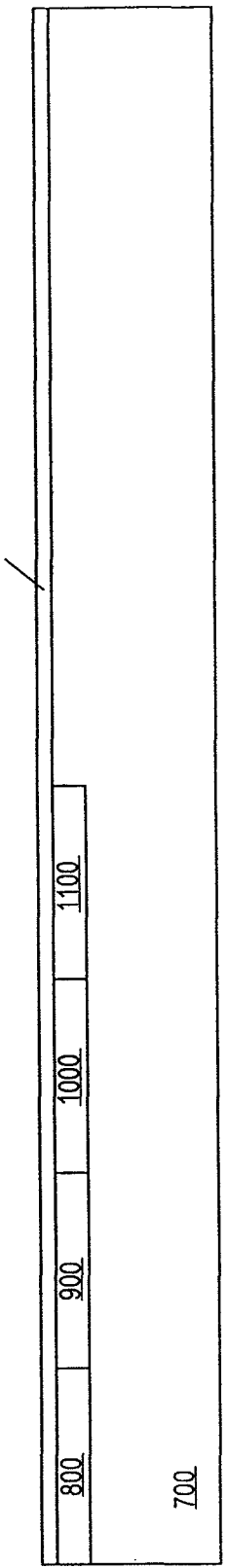

FIG. 12 shows an EPI deposition 1200. Though an undoped epitaxial channel is contemplated, selective masking may be implemented in order to provide certain transistor elements with a doped channel layer.

Figure 13:
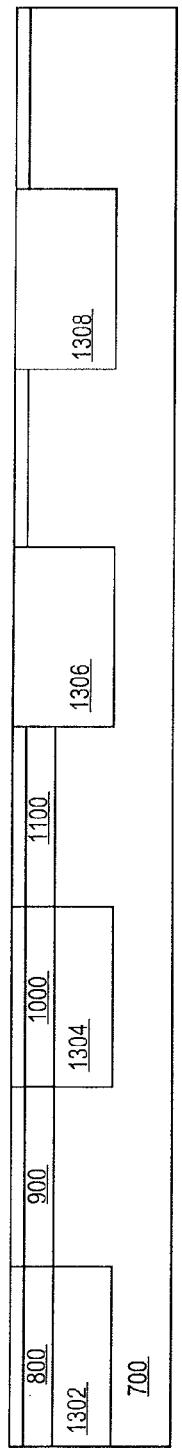

FIG. 13 shows implanted N-wells 1302, 1304, 1306, and 1308 for various P-type devices, such as the PMOS DDC digital logic device, PMOS DDC analog device, PMOS legacy digital logic device, and PMOS legacy analog device to be formed in this example.

Figure 14:
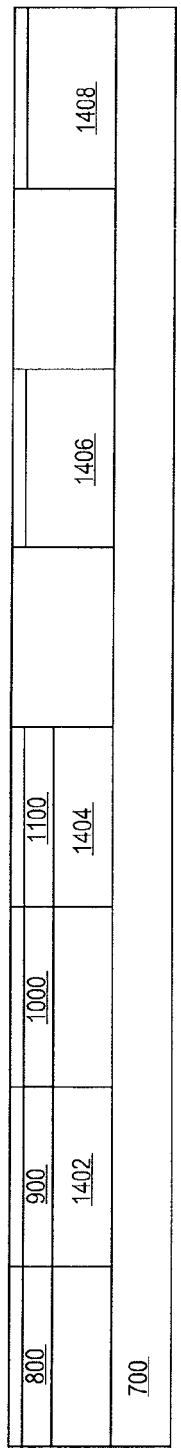

FIG. 14 shows implanted P-wells 1402, 1404, 1406, 1408, for various N-type devices, such as the NMOS DDC digital logic device, NMOS DDC analog device, NMOS legacy digital logic device, and NMOS legacy analog device to be formed in this example.

Figure 15:
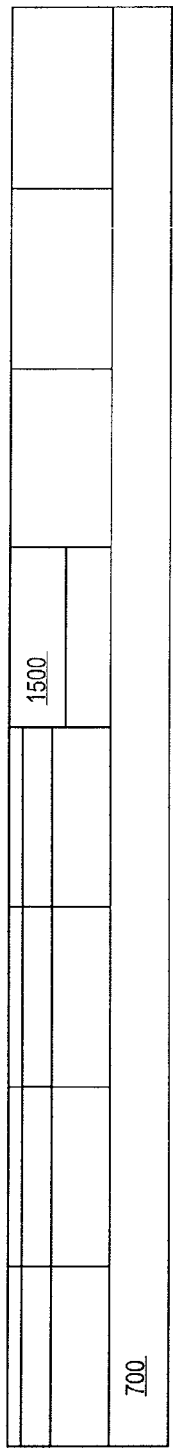
Figure 16:
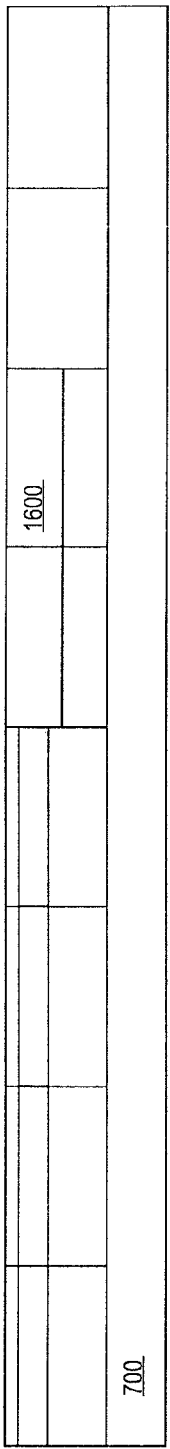

FIG. 15 shows an implanted N-type threshold voltage layer ($V_T$) 1500 for use in a PMOS legacy digital logic device of this example.

Figure 17:
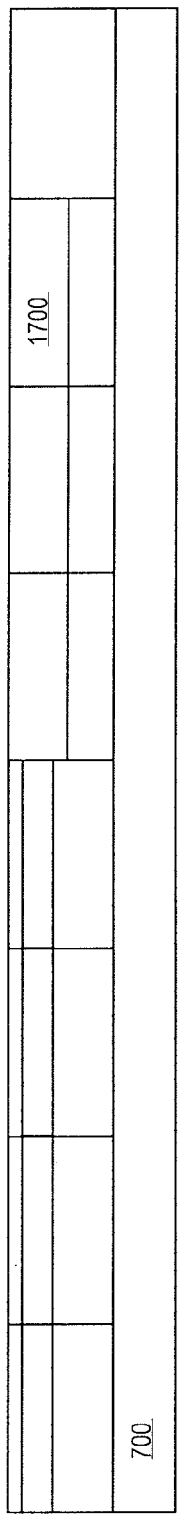

FIG. 17 shows an implanted analog N-type $V_T$ layer 1700 for the PMOS legacy analog device in this example.

Figure 18:
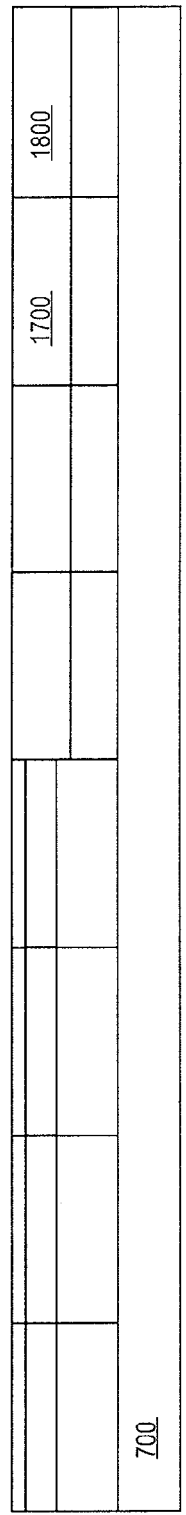

FIG. 18 shows an implanted analog P-type $V_T$ layer 1800 for the NMOS legacy analog device in this example.

Figure 19:
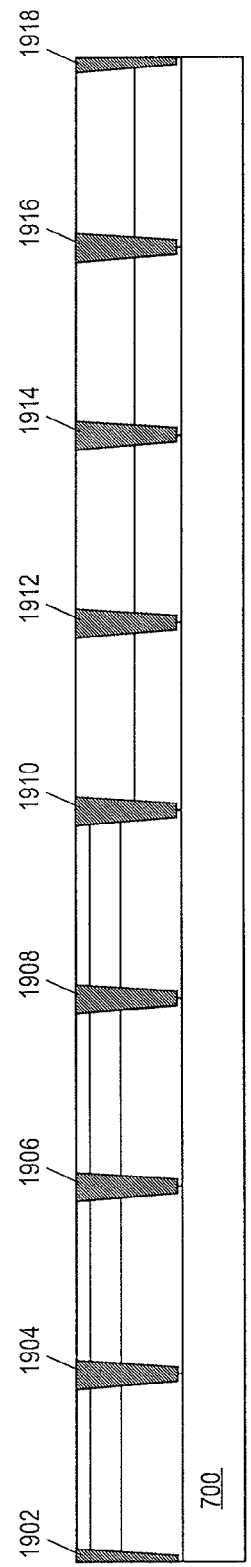

FIG. 19 shows STI formations 1902-1918 located between, down through the shallow wells of each device.

Figure 20:
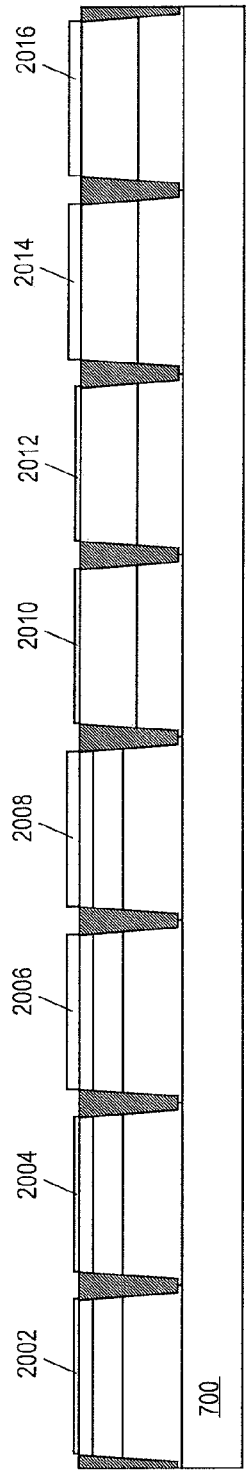

FIG. 20 shows gate oxidation layers 2002-2016 performed on each device, including single, double and triple gate oxidation layers for different devices. In this example, thin single oxidation layers are formed for digital devices, and relatively thicker double or triple oxidation for analog devices.

Figure 21:
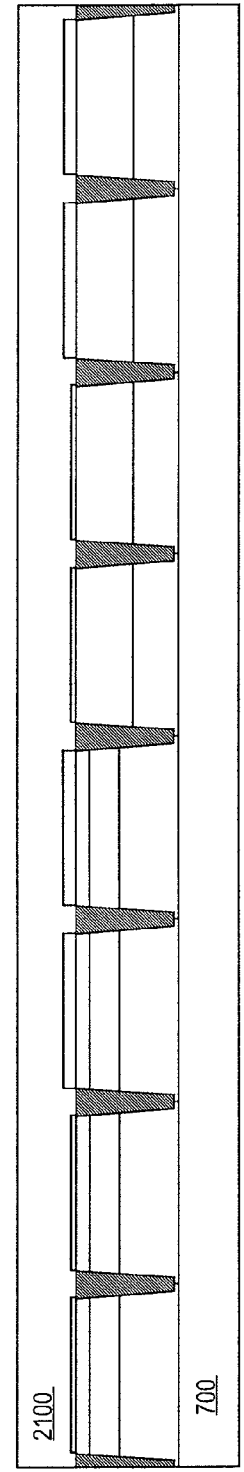

FIG. 21 shows a polygate layer 2100 formed over all devices.

Figure 22:
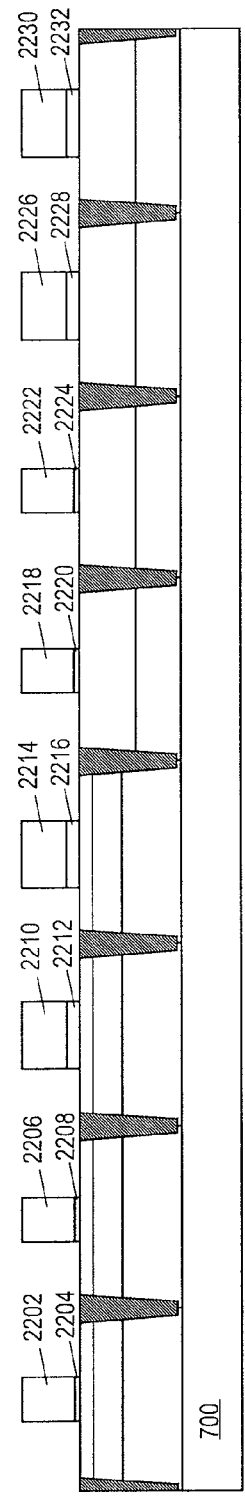

FIG. 22 shows the selective removal of the polygate and oxidation layers to form separate gates and corresponding gate oxide layers 2202-2232.

Figure 23:
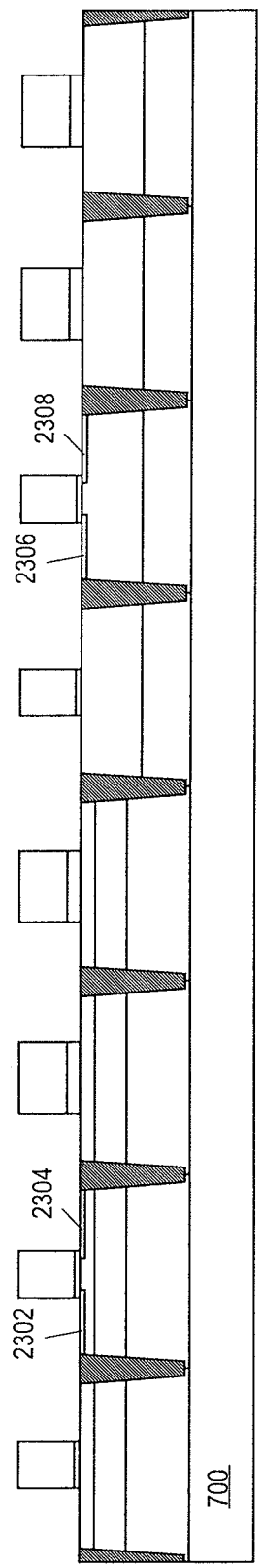

FIG. 23 shows the forming of P-type LDD 2302-2308 on two digital devices, the NMOS DDC digital logic device and NMOS legacy digital logic device in this example.

Figure 24:
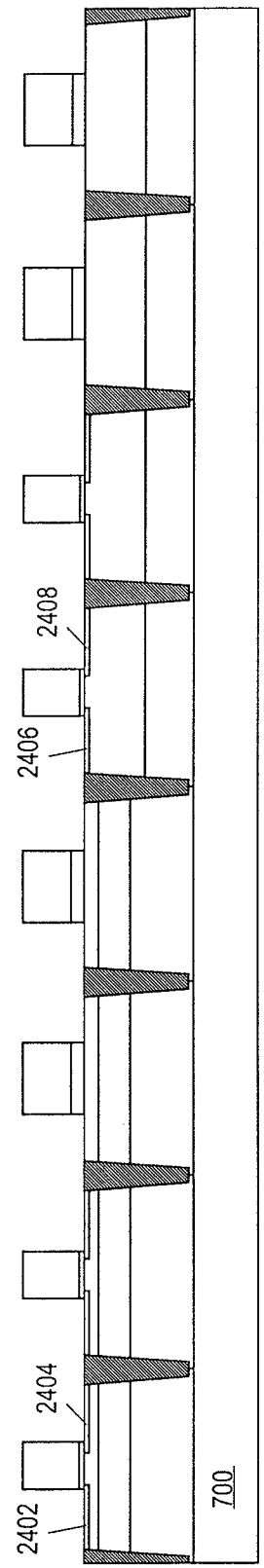

FIG. 24 shows the formation of N-type LDD 2402-2408 on two other digital devices, the PMOS DDC digital logic device and PMOS legacy digital logic device in this example.

FIG. 25 shows the formation of P-type LDD 2502-2508 on two analog devices, the PMOS DDC analog device and PMOS legacy analog device in this example.

FIG. 26 shows the formation of N-type LDD 2602-2608 on two other analog devices, the NMOS DDC analog device and NMOS legacy analog device in this example.

Figure 27:
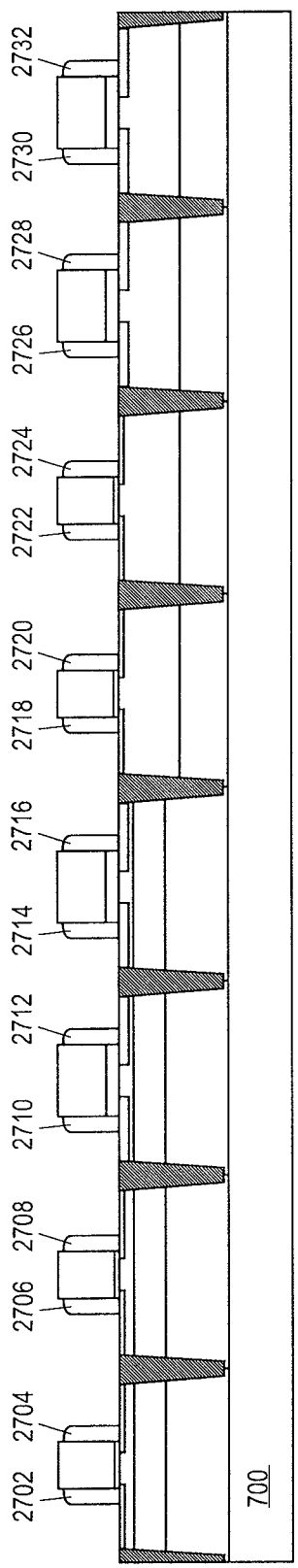

FIG. 27 shows the formation of spacers 2702-2732 for each gate stack.

Figure 28:
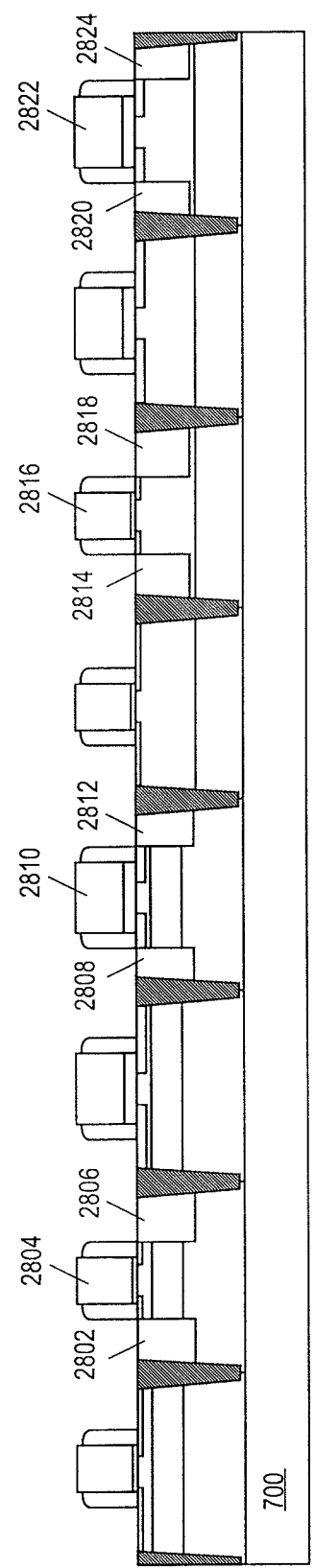

FIG. 28 shows the implantation of P-type material 2802-2824 in P-type digital and analog devices, including the PMOS DDC logic device, the PMOS DDC analog device, the PMOS legacy logic device and PMOS legacy analog device in this example.

Figure 29:
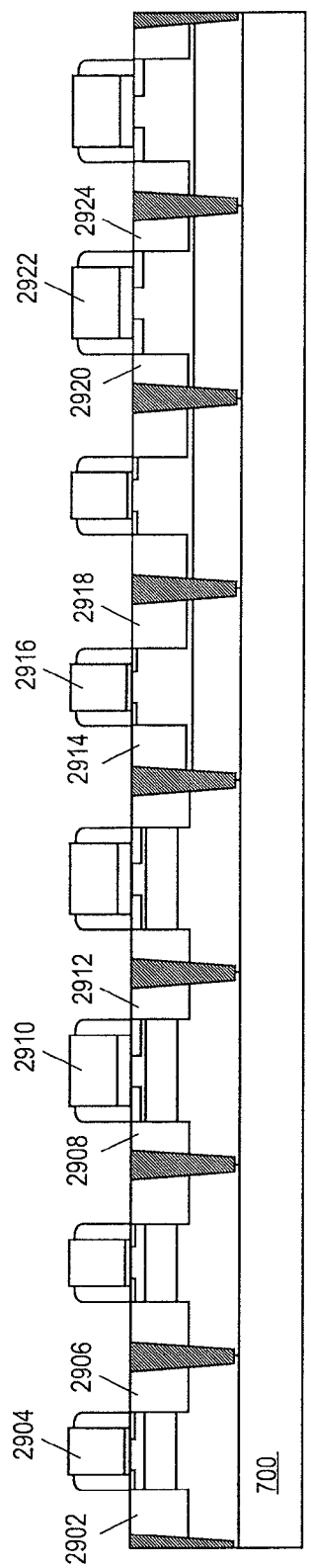

FIG. 29 shows the implantation of N-type material 2902-2924 in N-type digital and analog devices, including the NMOS DDC digital logic device, NMOS DDC analog device, the NMOS legacy digital logic device, and the NMOS legacy analog device in this example.

Figure 30:
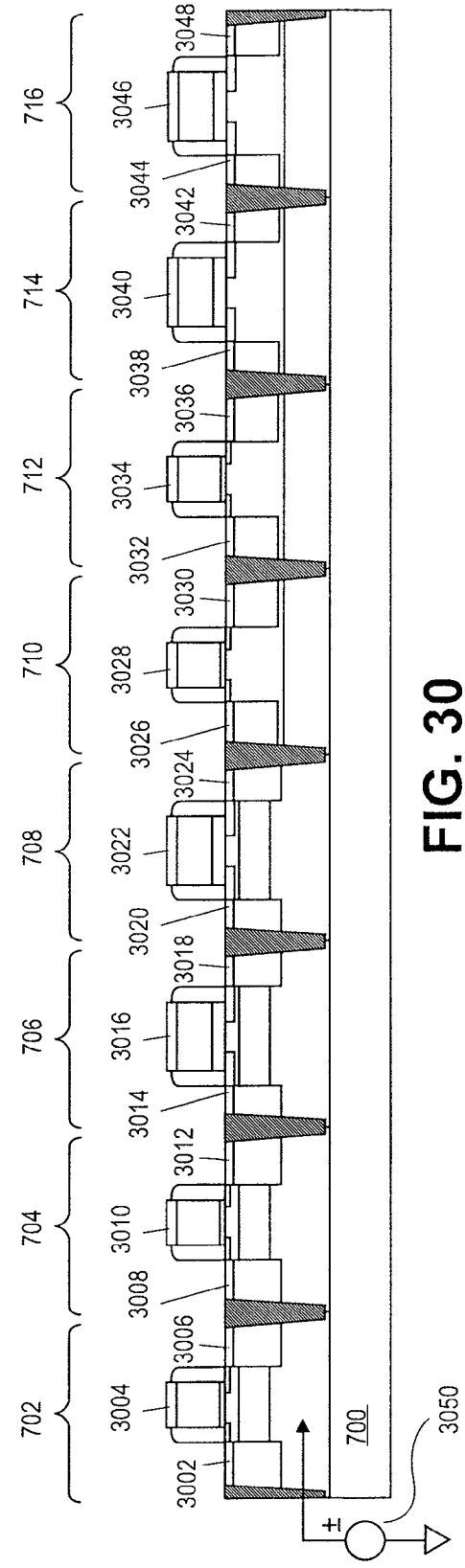

FIG. 30 illustrates deposition of silicide 3002-3048 on each device's exposed source, gate and drain. Body bias 3050 communicating with the well or body of device 702 is included to illustrate the possibility of biasing the body of any one of the transistors in order to control the $V_T$ of one or more devices. Thus, the devices formed in FIG. 30 include:

a PMOS DDC digital logic device 702;
an NMOS DDC digital logic device 704;
a PMOS DDC analog device 706;
an NMOS DDC analog device 708;
a PMOS legacy digital logic device 710;
an NMOS legacy digital logic device 712;
a PMOS legacy analog device 714; and
an NMOS legacy analog device 716.

There are many different approaches to processing these novel features and structures. Those skilled in the art will understand that, given this disclosure, there are numerous variations on the particular manufacturing process steps and parameters for making such circuits. The following are examples.

In one exemplary process, and oxide layer is formed in a temperature range of 700 to 900° C. over a period of 0 to 60 seconds.

For the PMOS well implants, the N+ implant may be implanted within a range from 10 to 80 keV, and at concentrations from $1\times10^{13}$ to $8\times10^{13}/cm^2$. As+ may be implanted within a range of 5 to 60 keV, and at concentrations from $1\times10^{13}$ to $8\times10^{13}/cm^2$.

For NMOS well implants, the boron implant B+implant may be within a range of 0.5 to 5 keV, and within a concentration range of $1\times10^{13}$ to $8\times10^{13}/cm^2$. A germanium implant Ge+, may be performed within a range of 10 to 60 keV, and at a concentration of $1\times10^{14}$ to $5\times10^{14}/cm^2$. A carbon implant, C+, may be performed at a range of 0.5 to 5 keV, and at a concentration of $1\times10^{13}$ to $8\times10^{13}/cm^2$.

A low temperature recrystallization anneal may be performed at a range of 550-600° C., over a period of 30 to 150 seconds.

A high temperature defect elimination anneal may be performed within a range of 900 to 1025° C. over a period of 0 to 10 seconds.

An EPI deposition of intrinsic Si may be performed within a range of 500 to 700° C., and at a thickness of 10 to 75 nm.

A shallow trench isolation, trench patterning, trench etch, sacrificial oxidation, trench fill, trench polish may be performed also.

Standard CMOS processing beyond this point including all standard thermal cycles, such as for example poly-Si deposition/etch, SPCR deposition/etch, multiple spike anneals, and other processes may be performed within a range of 900 to 1025° C.

In another process, where some devices on the wafer are DDC type devices and others are non-DDC type devices, a process may include the same process flow as that described immediately above, where some implants may be selectively masked over certain devices that do not need DDC process.

In yet another process, a process may include the same process flow as that described immediately above, where some implants are selectively performed after an EPI deposition instead of before an EPI deposition in order to form non-DDC configured devices in those regions.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Accordingly, the specification and drawings are to be regarded in an illustrative rather than a restrictive sense.

What is claimed is:

1. A method for fabricating an integrated circuit having transistor devices defined on a substrate:
    forming a first screening layer for a first digital device, the first screening layer being positioned below a first gate of the first digital device, the first screening layer having a first dopant concentration between $1\times10^{18}$ to $1\times10^{20}$ atoms/$cm^3$;
    forming a second screening layer for a second device type, the second screening layer being positioned below a second gate of the second device type, the second screening layer having a second dopant concentration between $1\times10^{18}$ to $1\times10^{20}$ atoms/$cm^3$;
    performing an epitaxial deposition to form a common epitaxial layer for the first digital device and the second device type, the common epitaxial layer being positioned above and adjacent to the first screening layer and the second screening layer;
    maintaining at least a portion of the common epitaxial layer as a substantially undoped channel region for the first digital device, the substantially undoped channel region of the first digital device having a first dopant concentration less than 5×10 atoms/cm³; and performing a shallow trench isolation between the first digital device and the second device type by etching the common epitaxial layer to form a trench and depositing a dielectric within the trench, the shallow trench isolation being performed after forming the common epitaxial layer, wherein the shallow trench isolation extends beyond the first screening layer and the second screening layer.

2. The method of claim 1, wherein forming the first screening layer comprises implanting the first screening layer into the substrate, and wherein forming the second screening layer comprises implanting the second screening layer into the substrate.

3. The method of claim 2, further comprising:
performing low temperature recrystallization annealing after implanting the first screening layer and the second screening layer.

4. The method of claim 3, wherein the low temperature crystallization anneal is performed at a temperature range of 550° C. to 600° C.

5. The method of claim 2, further comprising:
performing a high temperature annealing after implanting the first screening layer and the second screening layer;
forming an oxide layer on the substrate after performing the high temperature annealing; and
stripping the oxide layer before performing the epitaxial deposition to form the common epitaxial layer.

6. The method of claim 5, wherein forming the oxide layer on the substrate comprises forming a thin oxide layer on the substrate.

7. The method of claim 1, wherein forming the first screening layer for the first digital device further comprises forming a first P-type screening layer for a first transistor element of the first digital device, and forming a first N-type screening layer for a second transistor element of the first digital device.

8. The method of claim 7, further comprising:
forming a body tap operable to apply a body bias voltage to one or more of the transistor element of the first digital device.

9. The method of claim 1, wherein forming the second screening layer for the second device type further comprises forming a second P-type screening layer for a first transistor element of the second device type, and forming a second N-type screening layer for a second transistor element of the second device type.

10. The method of claim 9, further comprising:
implanting a P-type well for the first transistor element of the second device type;
implanting an N-type well for the second transistor element of the second device type;
implanting a P-type layer over the second P-type screening layer, that wherein the P-type layer operates as a first threshold voltage control layer for the first transistor element of the second device type; and
implanting an N-type layer over the second N-type screening layer, that wherein the N-type layer operates as a second threshold voltage control layer for the second transistor element of the second device type.

11. The method of claim 10, further comprising:
forming a body tap to at least one of the P-type and N-type wells, the body tap being operable to apply a bias voltage to the transistor body.

12. The method of claim 1, further comprising:
performing a diffusion prevention treatment.

13. The method of claim 12, wherein performing the diffusion prevention treatment further comprises implanting at least one of indium and carbon.

14. The method of claim 12, wherein performing the diffusion prevention treatment further comprises forming a semiconductor layer between the screening layer and the common epitaxial layer.

15. The method of claim 14, the semiconductor layer includes carbon.

16. The method of claim 14, wherein forming the semiconductor layer comprises depositing SiGe before forming the common epitaxial layer.

17. The method of claim 1, wherein the second device type is a digital legacy device having post-epitaxial deposition channel implants to provide legacy transistor functionality.

18. The method of claim 1, wherein
the second device type is an analog device.

19. The method of claim 1, further comprising:
forming one of single, double, or triple gate oxidation layers for each device.

* * * * *